United States Patent [19]
Caywood

[11] Patent Number: 5,790,455
[45] Date of Patent: Aug. 4, 1998

[54] LOW VOLTAGE SINGLE SUPPLY CMOS ELECTRICALLY ERASABLE READ-ONLY MEMORY

[75] Inventor: John M. Caywood, Sunnyvale, Calif.

[73] Assignee: John Caywood, Sunnyvale, Calif.

[21] Appl. No.: 778,315

[22] Filed: Jan. 2, 1997

[51] Int. Cl.$^6$ .................................................. G11C 11/34
[52] U.S. Cl. ................ 365/185.06; 365/149; 365/185.27
[58] Field of Search ......................... 365/185.06, 149, 365/185.27, 185.23, 185.18, 185.22, 185.11, 185.08

[56] References Cited

U.S. PATENT DOCUMENTS

| | | |
|---|---|---|
| 4,115,914 | 9/1978 | Harari . |
| 4,203,158 | 5/1980 | Frohman-Bentchkowsky . |
| 4,209,849 | 6/1980 | Schrenk . |
| 4,399,523 | 8/1983 | Gerber et al. . |
| 4,477,825 | 10/1984 | Yaron et al. . |
| 4,479,203 | 10/1984 | Kuo ........................................ 365/218 |
| 4,558,344 | 12/1985 | Perlegos . |
| 4,616,339 | 10/1986 | Cuppens et al. .................... 365/185.11 |
| 4,701,776 | 10/1987 | Perlegos et al. . |
| 5,295,096 | 3/1994 | Nakajima ............................. 365/185.06 |
| 5,404,329 | 4/1995 | Yamagata et al. ...................... 365/149 |
| 5,430,675 | 7/1995 | Yajima et al. ....................... 365/185.06 |
| 5,490,107 | 2/1996 | Akaogi et al. ...................... 365/185.22 |
| 5,568,421 | 10/1996 | Aritome ............................... 365/185.06 |
| 5,636,160 | 6/1997 | Omino et al. ....................... 365/185.18 |

OTHER PUBLICATIONS

"A 1.5 V Single-Supply One-Transistor CMOS EEPROM", Bernard Gerber, Jean-Claude Martin, Jean Fellrath, IEEE Journal of Solid-State Circuits, vol. SC-16, No. 3, Jun. 1981, pp. 195-200.

"Session XII: PROMs and EROMs. THPM 12.6: A 16kb Electrically Erasable Nonvolatile Memory", William S. Johnson, George Perlegos, Alan Renninger, Greg Kuhn and T.R. Ranganath, ISSCC 80, Thursday, Feb. 14, 1980, Continental Ballroom 4–5/4:15 p.m., pp. 152–153.

"Low-Voltage Single Supply CMOS Electrically Erasable Read-Only Memory", Bernard Gerber and Jean Fellrath, IEEE Transactions on Electron Devices, vol. ED-27, No. 7, Jul. 1980, p. 1211-1216.

Yeargain, J and Kuo, C, *A High Density Floating-Gate EEPROM Cell*, IEEE IEDM 81, 2.2 (1981).

Ohnakado, T., et al., *Novel Electron Injection Method Using Band-to-Band Tunneling Induced Hot Electron (BBHE) for Flash Memory with a P-channel Cell*, IEEE, IEDM 95-279, pp. 11.5.1-11.5.4 (1995).

*Primary Examiner*—A. Zarabian
*Attorney, Agent, or Firm*—Steven F. Caserza; Flehr Hohbach test Albritton & Herbert

[57] ABSTRACT

P channel EEPROM cells are designed for integration into arrays written with single polarity signals developed from small, low power charge pumps. These cells reduce the additional masking steps that must be added to a CMOS logic process for EEPROM to only one additional step. The novel cells of this invention enable the array to function with a $V_{PP}$ about 2 V less than that required by an N channel EEPROM cell, with similar writing speed and tunnel oxide thickness.

35 Claims, 15 Drawing Sheets

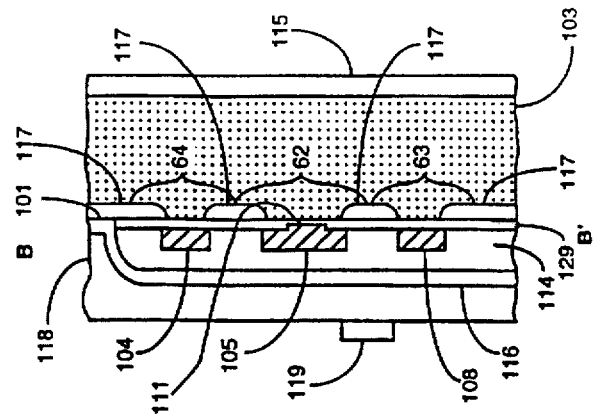
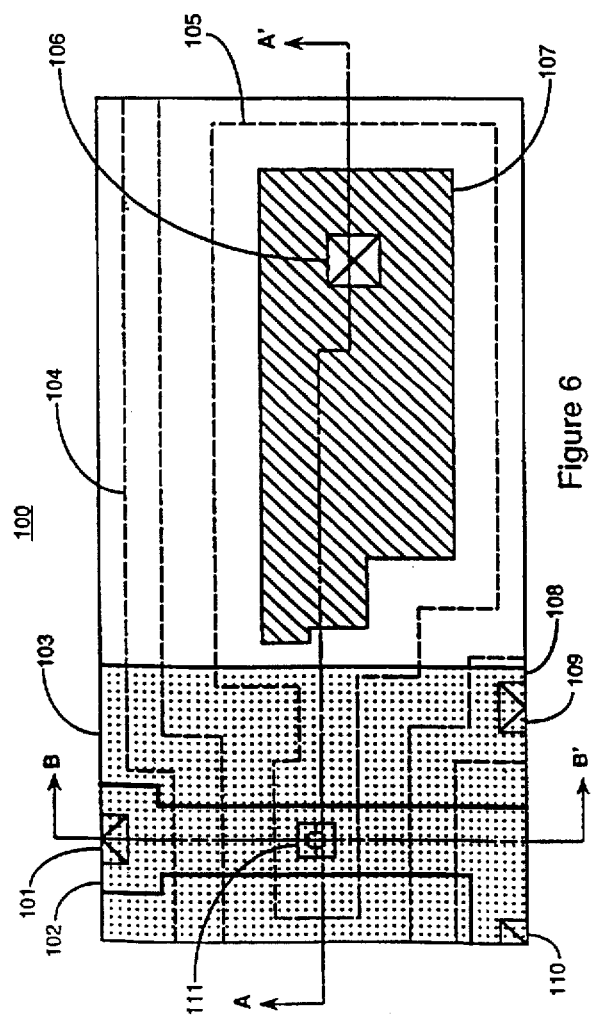
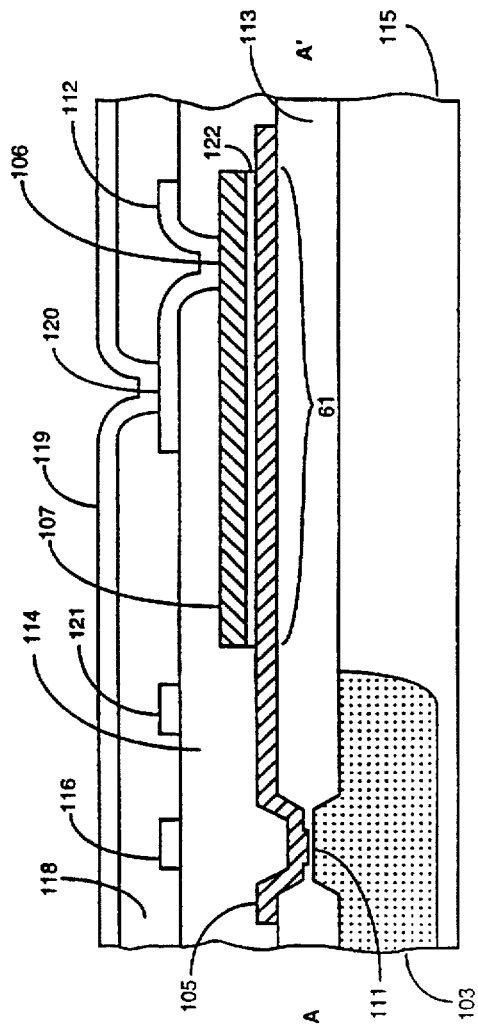

LOW VOLTAGE SINGLE SUPPLY CMOS ELECTRICALLY ERASABLE READ-ONLY MEMORY

BACKGROUND

1. Field of the Invention

This invention pertains to electronic memories and in particular to nonvolatile memory cells and cell organization suitable for operation with byte alterability of the nonvolatile information stored in the memory.

2. Prior Art

There is a long history of nonvolatile memory devices and more particularly electrically erasable programmable read only memory (EEPROM) devices. All prior art commercial byte alterable EEPROMs have used N channel devices as the memory transistor. Such an N channel EEPROM cell 10 typical of current technology is shown in the top view of FIG. 1a and the cross section of FIG. 1b.

As shown in FIG. 1a there are two layers of polycrystalline silicon 13 and 14 formed on and insulated from silicon substrate 24. The cell includes select transistor 29 and memory transistor 28. The substrate under memory transistor 28 is doped P type except where locally doped N type to form source/drain regions 16 and 23. The first layer of polycrystalline deposited is called poly 1. The poly 1 feature 14 has no connections to other conductors and is therefore referred to as a floating gate. This portion of the poly 1 layer forms the gate of memory transistor 28. The second layer of polycrystalline silicon, called poly 2, is used to form a transistor 29, having polycrystalline silicon gate 12, that acts as a select transistor between contact 19 and memory transistor 28. Poly 2 layer is also used to form control gate 13 of memory transistor 28, which is capacitively coupled to floating gate 14.

N type region 15 is located under a thin tunnel oxide window 11. Region 15 is used during programming and erasing. (In this application, the IEEE standard 1005 will be followed consistently for nomenclature. Therefore, programming is defined as putting electrons onto the floating gate and erasing is defined as removing electrons from the floating gate.) There is also a buried diffusion 17 on the source side of the memory transistor 28. This is included merely so that the channel length is not alignment sensitive and could be omitted without loss of functionality. The buried diffusions are so called because they lie under the polycrystalline silicon layers. (In some designs they also lie under the field oxide.) Thick field oxide 18, which exists outside of the "T" shaped region of thin oxide bounded by the heavy lines in FIG. 1a, provides isolation between the transistors and the N type diffusions where desired. The regions under field oxide 15 may have enhanced P type doping relative to the regions under the gates in order to raise the threshold voltages of the parasitic field transistors.

Typical operation will have floating gate 14 charged positively with respect to ground when erased and charged negatively with respect to ground when programmed. To read memory transistor 28, control gate 13 is grounded and gate 12 of select transistor 29 is biased positively to provide a low resistance path from its drain contact 19 to drain 15 of memory transistor 28. Drain contact 19 provides connection to metal bit line 25 as is seen in the cross section view of FIG. 1b (the metal is omitted from the top view of FIG. 1a in the interests of clarity). Bit line 25 is biased at a modest positive voltage (e.g. 2 V) and the common source line 16 is biased at ground. If floating gate 14 is erased, current can flow from bit line 25 to source region 16. If floating gate 14 is programmed, memory transistor 28 is in a nonconducting state and no current flows. The presence or absence of current flow is sensed to determine the state stored by memory transistor 14.

The oxide in tunnel window 11 is typically about 10 nm thick. To program memory cell 28, floating gate 14 must be capacitively coupled to a sufficiently positive potential with respect to drain 15 that a field of about 10 MV/cm appears across tunnel oxide 11. This is accomplished by biasing poly 2 control gate 13 at about 20 V while biasing select gate 12 at a sufficiently high potential that select transistor 29 is conducting with bit line 25 at ground potential. Under these conditions, drain region 15 provides a source of electrons on the cathode side of tunnel oxide 11. With 10 MV/cm appearing across tunnel oxide 11, Fowler-Nordheim tunneling occurs and charges floating gate 14 negatively.

To erase memory transistor 28, the bias across tunnel oxide 11 must be reversed. This is accomplished by applying a high bias to drain 15 of memory transistor 28 while poly 2 control gate 13 is biased at ground in order to keep control gate 13 capacitively coupled to a low voltage. The high voltage is applied to drain 15 of memory transistor 28 by applying the desired voltage to bit line 25 while gate 12 of select transistor 29 is biased at a potential that is higher than the desired voltage by at least the threshold voltage of select transistor 29.

The operation of this cell in an array can be understood with reference to FIGS. 2a and 2b, which shows a portion of a prior art memory array 38 including a single word line 31 and associated bit lines 32-0 through 32-7, thereby forming a portion of a memory capable of storing a single 8 bit word. (In this and subsequent schematic drawings, the transistor gate with a small notch directed at the channel region is used indicate a transistor in which one portion of the gate oxide has been thinned to enhance the tunneling current.) To write a desired data pattern into a word, all bits of the word are first programmed and then selected bits are erased to achieve the desired pattern. Selection of the word to be programmed is achieved with the combination of word line 31 and word line select transistor 37 in FIG. 2b. A high voltage, $V_{PP}+V_{TN}$, where $V_{PP}$ is a positive programming voltage (typically approximately 18 volts) and $V_{TN}$ is the threshold voltage of an N channel transistor (typically approximately 4 volts), is applied to word line 31 to select the desired row of the memory array. $V_{PP}$ is applied to column 35 associated with the desired word. This voltage passes through word select transistor 37 to the control gates 34-0 through 34-7 of all of the transistors in the word to be programmed. After all of the floating gates in the selected word are programmed, $V_{SS}$ (ground) is applied to line 35 and $V_{PP}$ is applied to those bit lines 32-0 through 32-7 containing bits that are to be erased, while the bit lines containing bits that are not to be erased are biased at $V_{SS}$.

There is convenient result of this particular sequence of programming operation. Because all transistors in the selected word are initially programmed, they are in a nonconducting state when their control gates are grounded by applying $V_{SS}$ to line 35. When $V_{PP}$ is applied to the selected bit lines, the floating gates of the selected transistors are erased into a conducting state and the common source line 35 is charged up. However, the voltage on the common source line is limited to $Vfg-V_{TN}$, where Vfg is the floating gate potential. This moderate voltage is too small to punch through the programmed transistors and so no current flows from the bit lines that are biased at $V_{PP}$ to those that are biased at $V_{SS}$. It is this lack of direct current path that makes it possible to operate commercial EEPROMs from a single logic level power supply with all of the needed high voltages being generated on the chip by relatively small, low power charge pumps.

There are a couple of features of this prior art that limit its desirability for application in integrated circuit products in which only a small number of EEPROM bits are desired in a circuit that is primarily logic or a mixed signal product. The prior art cell depicted in FIGS. 1a and 1b has at least three additional masking steps that are not required for the fabrication of an MOS structure containing logic circuitry but not containing EEPROM cells: the second layer of polycrystalline silicon, the thin tunnel oxide window, and the buried N region under the polycrystalline silicon floating gate. These masking steps and the processes associated with them add cost to the manufacturing process, perhaps as much as 20% to the cost of manufacturing a CMOS wafer. This is a high price to pay for functionality that is only used in a small portion of the product when only a small number of EEPROM bits are required. To reduce this cost, there have been a number of single poly EEPROM cells developed. This reduces somewhat the cost of adding EEPROM functionality to a circuit, but is still more expensive than is really desirable because of the continuing need for the additional processing steps associated with forming the tunnel oxide window and the diffusions 15 and 17.

A second hindrance to incorporating EEPROM technology into existing CMOS processes is the relatively high voltages required for the write operation. An electric field of about 10 MV/cm across the tunnel oxide is required for a sufficiently large Fowler-Nordheim tunneling current to write to a cell in times measured in msec. In addition, not all of the voltage applied to the control gate is coupled to the floating gate. In practical cases, the capacitive coupling ratio between the control gate and the floating gate is in the range 0.6 to 0.8 (i.e. 60 to 80% of voltage applied to the control gate is coupled to the floating gate). This means that $V_{PP}$ greater than about 12 V is required between the control gate and the tunneling diffusion in the substrate. To achieve this a voltage which was earlier expressed as $(V_{PP}+V_{TN})$ must be applied to the row line. The $V_{TN}$ in this equation is not the usual threshold voltage measured with the body of the N channel transistor grounded; rather this voltage threshold is the voltage threshold with the body of the transistor at $-V_{PP}$ as a result of the voltage on its source. When $V_{PP}$ is approximately 12 V, the threshold voltage can easily be increased as a result of the body effect to about 3 V. This results in a voltage of at least about 15 V being applied to the word line. Many logic processes will not reliably support a voltage of this magnitude.

SUMMARY OF THE INVENTION

In accordance with the teachings of this invention, these limitations are alleviated by reducing the magnitude of the applied voltage required for writing and by simplifying the process fabrication, thereby reducing manufacturing costs. To accomplish these ends, P channel EEPROM cells have been developed. These cells are designed for integration into arrays that can be written with single polarity signals that can be developed from relatively small, low power charge pumps that can be integrated into the integrated circuit products. These cells reduce the additional masking steps that must be added to a CMOS logic process for EEPROM to only one additional step. Furthermore, the novel cells of this invention enable the array to function with a value of $V_{PP}$ that is about 2 V less than that required by an N channel EEPROM cell of the prior art, with similar writing speed and tunnel oxide thickness. The price that is paid for these improvements is that the novel cells of this invention are somewhat larger (about 20% to 50% larger) as compared with prior art N channel EEPROM cells laid out with similar design rules.

Among the advantages of this invention are that it has the potential for significantly decreasing the development time and cost because it makes less stringent demands on the high voltage capability of the process and that it can decrease the cost of processing a wafer by 3 to 5%. For small EEPROM arrays, the chip area is dominated by the peripheral support circuitry (e.g. the row decoders, column multiplexers, sense amplifiers, and row voltage generation and control circuitry) so that increasing the cell size has little impact on the overall chip area. Thus there is real economic benefit in trading a slightly larger cell area for a less expensive process.

The focus of this invention is developing P channel EEPROM cells that can be integrated into arrays and supported with on chip circuitry so that the array is suitable for inclusion into an integrated circuit that is to function from a single voltage power supply. For use in practical array it is necessary to have cells that can be set into states to represent an arbitrary pattern of ones and zeroes. In the conventional N channel EEPROM, this is accomplished by programming all of the bits within a word and then erasing selected bits to establish a defined pattern within the array. There are select transistors so that words that are not intended to be written are isolated from the high voltages used for programming and erasure.

This invention includes two methods for performing these functions in a P channel array. In a first method, the cells within a word are all programmed, i.e. electrons are injected onto the floating gates, and then selectively erased. Because a P channel MOSFET with a gate negatively charged is in the conducting mode, a transistor is provided between the floating gate and the source in all of the cells in order to allow isolation of the cells form the common source during the selective erase. If the cells are connected through a common source during the erase, current will flow from the drain of the cell or cells that are to be erased to the drain(s) of those cell(s) that are not to be erased. Such a current would load any practicable on chip charge pumps such that the voltage applied to the drains to be erased would be limited to a low enough value that erasure would not occur. Adding a source select transistor allows current flow through the floating gate transistor to the source to be inhibited during the erase mode, but enabled during the read mode to provide a sense current.

A second method of operation described in this invention functions by erasing all bits within a word and then selectively programming those that are to be in the programmed state. With this method all the cells in a word can share a common source line. The selective programming is accomplished by providing a select transistor to the capacitor that controls the potential on the floating gate. This select transistor provides for matrix addressing of the control capacitor on a bit by bit basis.

BRIEF DESCRIPTION OF THE DRAWINGS

FIG. 6 is a top view, and FIGS. 6a and 6b are cross section views, showing the structure of one embodiment of the cell shown schematically in FIG. 5.

DETAILED DESCRIPTION OF THE INVENTION

Figure 3:
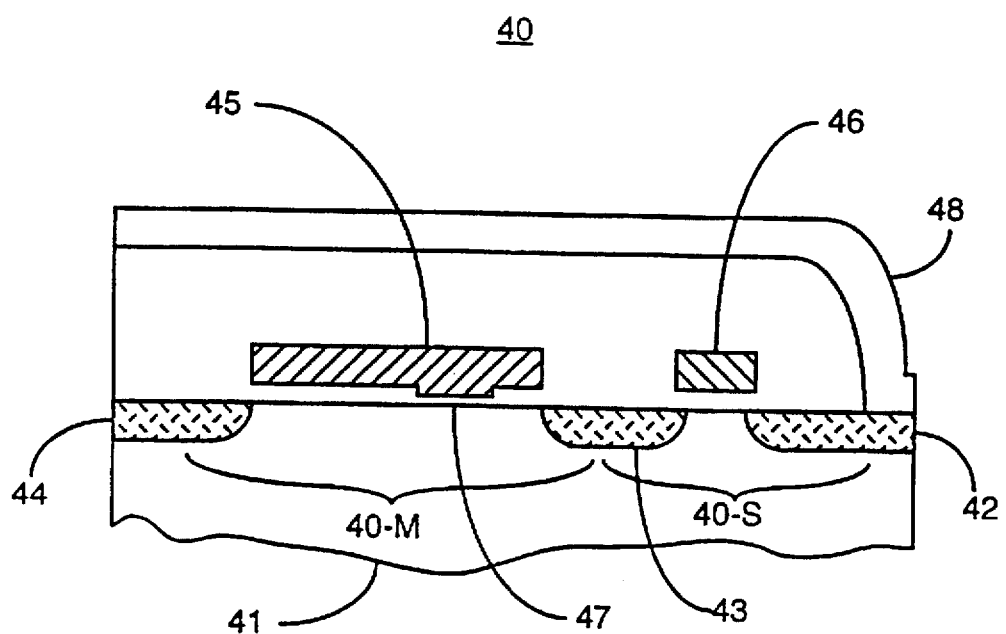
FIG. 3 is a cross sectional view through a portion of an EEPROM cell in accordance with one embodiment of the present invention.

A cross section through a portion of a P channel EEPROM memory cell in accordance with one embodiment of this invention is shown in FIG. 3. Cell 40 is fabricated in N well (or N type substrate) 41 into which P regions 42, 43, and 44 are located to form the sources and drains of P channel MOS transistors. The cross section is through two transistors; the polycrystalline silicon regions 46 and 45 form the gates of these two transistors. Shown is memory transistor 40-M with gate 45, drain 43 and source 44, and select transistor 40-S with gate 46, drain 42 and source 43. To program memory transistor 40-M, gate 45 is capacitively coupled to a high positive potential while N well 41 under the memory and select devices is grounded. Gate 46 of select transistor 40-S and bit line 48 are also grounded. This causes an accumulation region to form in N well 41 under floating gate 45. There is a thin oxide region 47 between floating gate 45 and N well 41. The electric field resulting from the potential between floating gate 45 and the accumulation layer across thin oxide 47 causes electrons to tunnel from the accumulation layer to floating gate 45, thereby programming memory transistor 40-M. To erase memory transistor 40-M, N well 41 is biased at $V_{PP}$ and $V_{PP}$ is applied to bit line 48. Gate 46 is grounded and floating gate 45 is capacitively coupled to a low voltage. Since gate 46 of the select transistor 40-S is turned on hard, diffusion 43 is biased at $V_{PP}$ and an inversion layer forms under floating gate 45. If node 44 is floating, the potential of the inversion layer will also be at $V_{PP}$. The resultant electric field across thin oxide 47 causes electron tunneling from floating gate 45 to the inversion region in N well 41. This causes floating gate 45 of memory transistor 40-M to be erased.

Figure 1A:
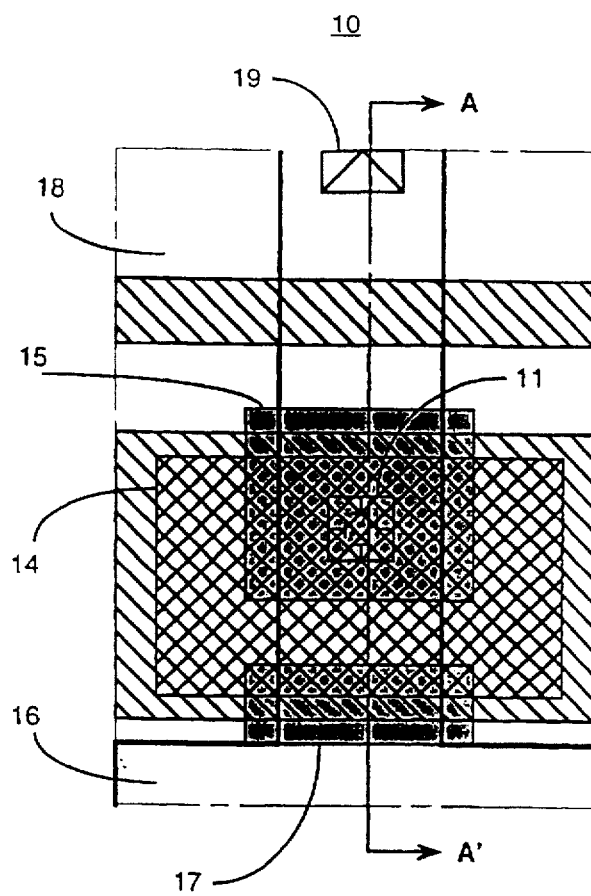
FIG. 1a is a top view of and FIG. 1b is a cross section through a typical prior art EEPROM cell.
Figure 1B:
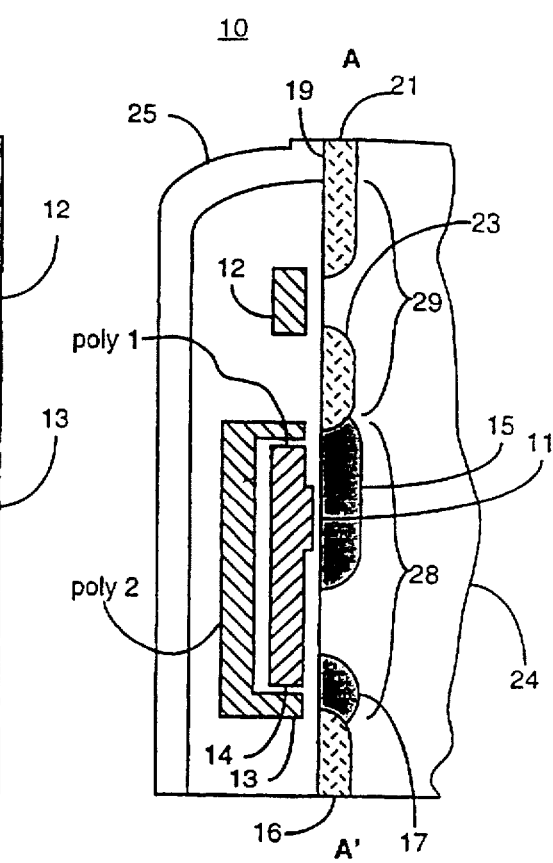
Figure 2A:
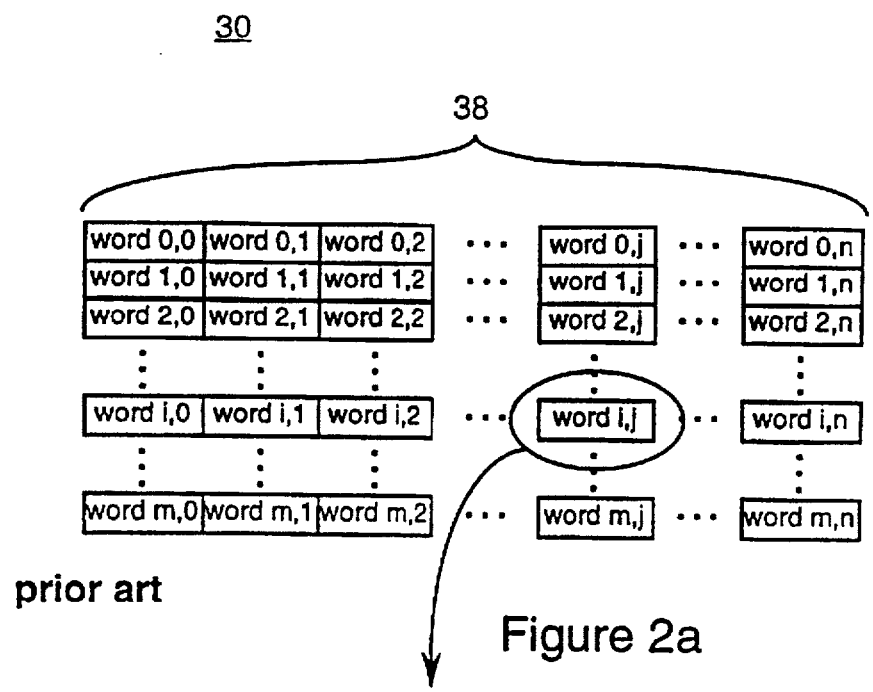
FIG. 2a is a block diagram of a typical prior art EEPROM array.
Figure 2B:
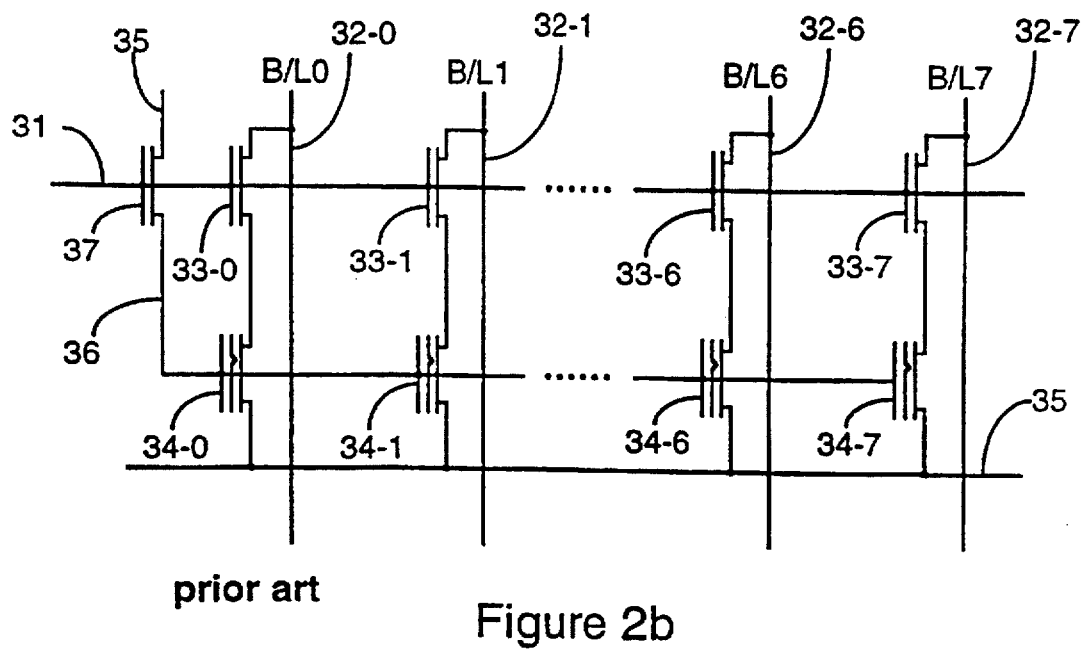
FIG. 2b is a schematic diagram of a group of prior art EEPROM cells integrated into an array for storing a word of data.

This embodiment of the present invention has two features that are advantageous for cases in which a small number of EEPROM bits are integrated into a circuit that is primarily intended to perform a logic or mixed signal function. Notice that because the body of memory transistor 40-M is N type, an additional diffusion under the tunnel oxide window is not needed, unlike the prior art of FIG. 1. This simplifies the manufacturing process. In an embodiment of FIG. 3 in which memory cell 40 is laid out using only one layer of polycrystalline silicon, this P channel embodiment of the present invention requires only one masking operation beyond that required for a CMOS logic fabrication process. Depending upon the scale of the process, the additional mask may be used either to form a thin oxide tunnel window in a process that has a relatively thick gate oxide for the logic transistors (e.g. a 1 micron minimum feature size logic or mixed signal process might have gate oxide thickness of 20 nm) or to form a thick gate oxide for the select and high voltage switching transistors in a process with gate oxide for the logic transistors that is thin enough to be used for the Fowler-Nordheim tunnel oxide. For example, a logic process with minimum gate lengths in the range of 0.4 to 0.5 microns might have gate oxides in the range of 9-10 nm. This oxide could be used for the Fowler-Nordheim tunnel oxide, but transistors with gate oxide thickness in the range of 20 nm are required for the select and switching transistors that control the high voltages used for the program and erase functions. A second advantage is that because select transistor 40-S is a P channel device, voltage in excess of $V_{PP}$ is not required on the gate of select transistor 40-S for writing. When select transistor 40-S is to pass voltage, its gate is set to ground. This allows the full $V_{PP}$ voltage used for erasing the cell to pass from the bit line to the drain of memory transistor 40-M.

Figure 4:
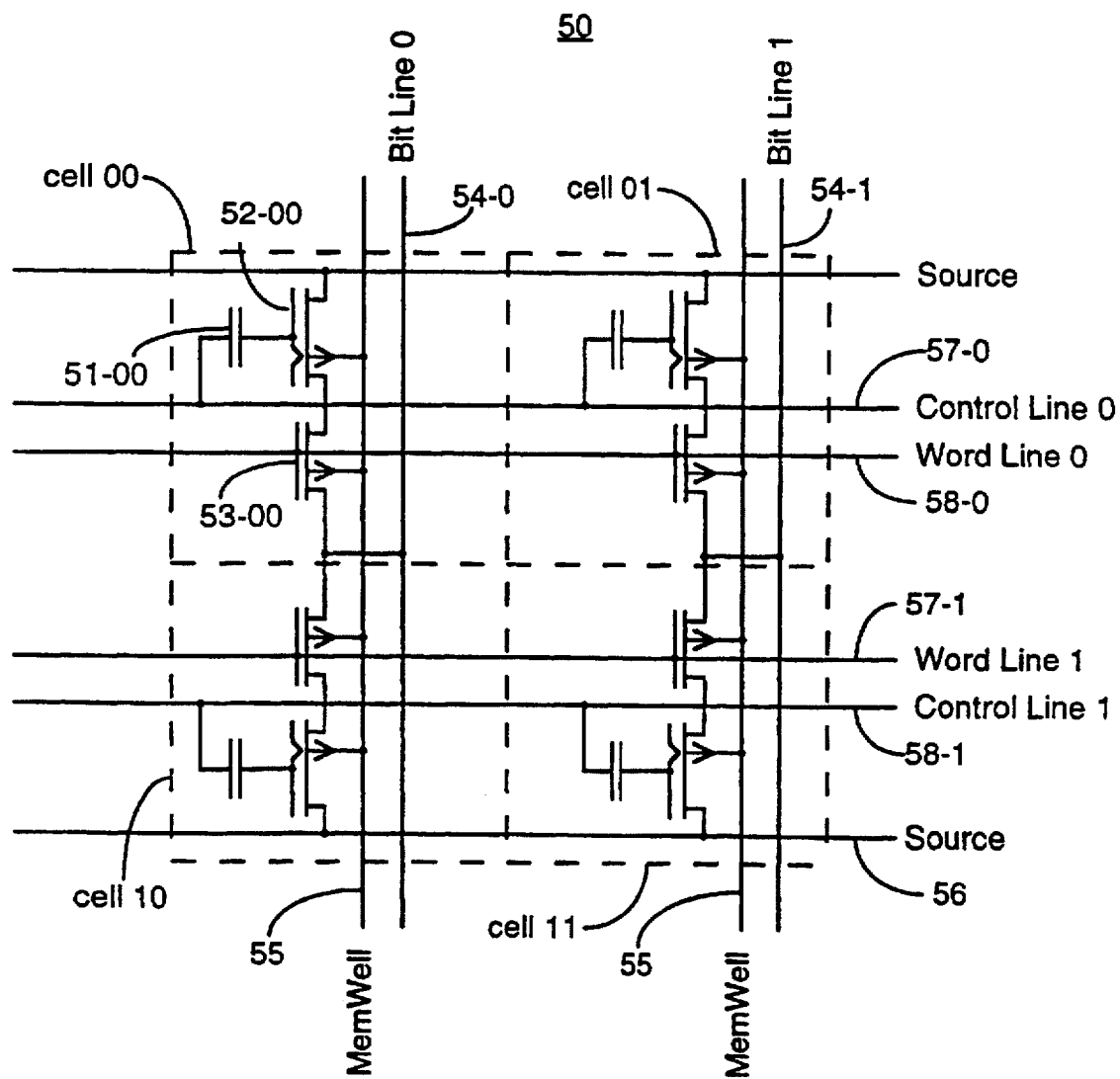
FIG. 4 is a schematic diagram illustrating a problem with simply transferring the array used for the conventional N channel EEPROM to a P channel implementation.

While the embodiment of FIG. 3 is useful in a number of circumstances, there is, however, a problem which can be seen by considering FIG. 4. Shown in FIG. 4 is a 2×2 array 50 of cells composed of the portion seen in FIG. 3 with the addition of coupling capacitor 51. The cells on row 0 can be programmed by biasing word line 0 at $V_{PP}$ with all of the other signals at ground as discussed in the previous paragraph. Consider what happens if the cell connected to row 0 and bit line 0, hereafter referred to as cell 00, is to be erased while cell 01 is to remain programmed. Following the approach described in the previous paragraph, the memory wells are biased at $V_{PP}$ and word line 0 and control line 0 are grounded. (Word line 1 would be biased at $V_{PP}$ to isolate row 1 from the voltages applied to the bit lines.) Because the cell on bit line 1 is to remain programmed, bit line 1 should be grounded. The inversion layer that forms under memory transistor 52-00 to cause erasure means that memory transistor 52-00 is conducting, which causes source 0 to charge towards $V_{PP}$. With control line 0 grounded to erase cell 00, memory transistor 52-01 is biased in the conducting state also, as is select transistor 53-01 of cell 01. This provides a current path from bit line 0 to bit line 1 through the two cells and the common source. This current would be large enough to load significantly any practical charge pump integrated into the integrated circuit containing this array. This current is very undesirable. The balance of this disclosure is concerned with alleviating this and other limitations that arise in implementing a P channel EEPROM cell in an array.

Figure 5:
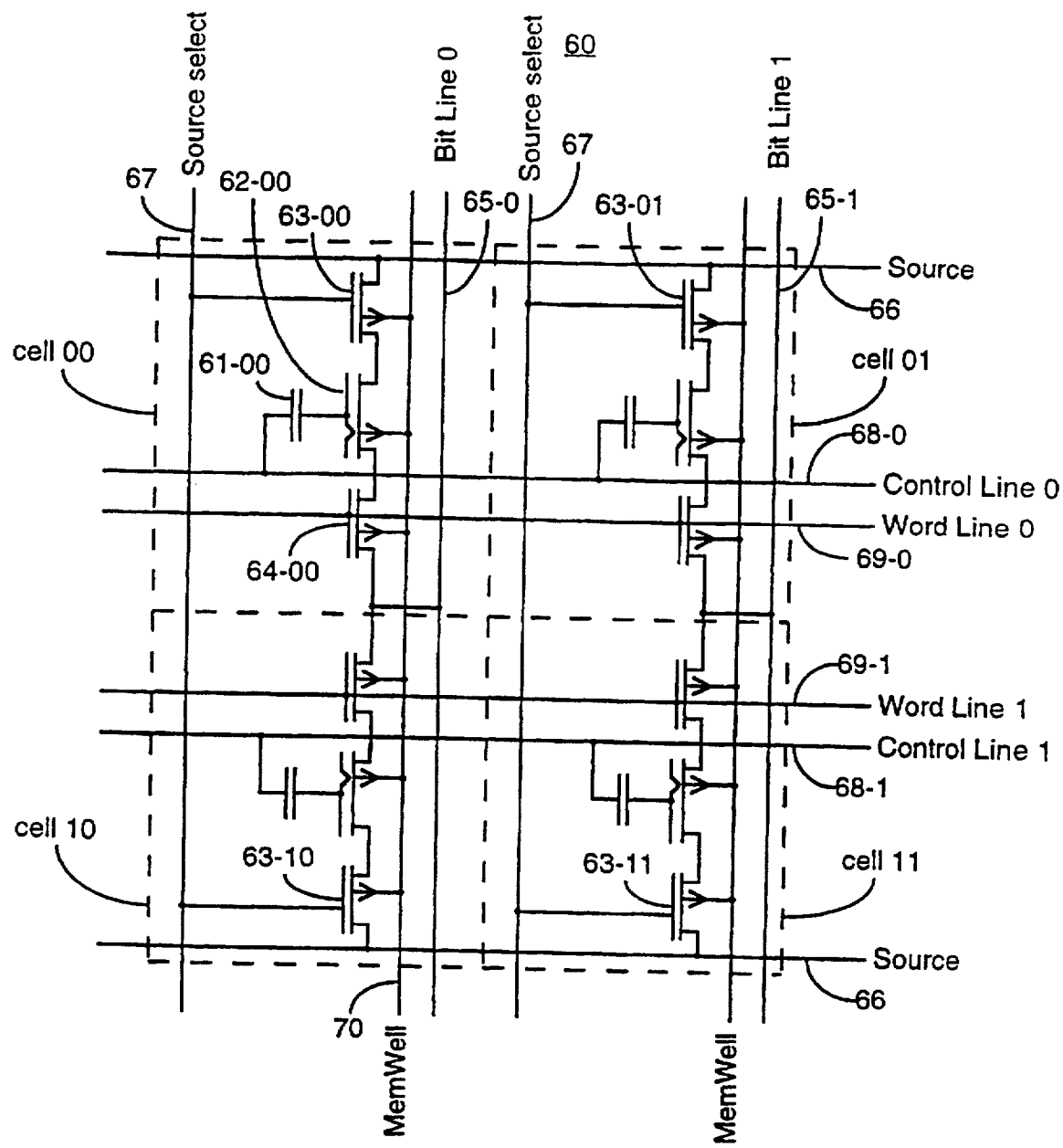
FIG. 5 is a schematic diagram of several cells in accordance with one of the embodiments of this invention embedded in a small array.

FIG. 5 shows schematically one embodiment of a 2×2 array 60 of memory cells that illustrates one embodiment of this invention which prevents an undesirable current path through the common source. Source select transistors 63-00 through 63-11 have been added in each respective cell 00 through 11. It is desirable to minimize to number of control signals that must be applied to a memory array. Therefore, in the preferred embodiment it will be assumed that all of the source select transistors gates are connected in common to simplify the periphery circuitry, although this is not necessary. The gates of the source select transistors of the unselected cells could be biased at other voltages without adversely affecting operation of the array. In the read mode, the gates of the source select transistors 63-00 through 63-11 are grounded, which allows any row to be selected with row select transistors 64-00 through 64-11 via word lines 69-0 and 69-1. In the erase mode, the gates of the source select transistors should all be biased at $V_{PP}$ to isolate the memory transistors 62-00 through 62-11 from the common source lines 66-1 and 66-2. In the program mode, the bias on source select transistors 63-00 through 63-11 is not critical; we choose to bias them at ground for the sake of simplicity, but they could equally well be biased at $V_{DD}$ or $V_{PP}$ without adversely affecting the programming operation.

The operation of the array shown schematically in FIG. 5 is shown in Table 1. In the read mode, the entry under row line indicates that the row line in at 0 for the selected row and $V_{DD}$ for the deselected row. In a similar fashion the double entries in the other modes are to read as the voltages applied to the selected and deselected nodes in that order.

TABLE 1

| | Read | Program | Erase |
|---|---|---|---|
| Control line | $V_{DD}$ | $V_{PP}$ (selected)<br>0 (deselected) | 0 |
| Row line | 0 (selected)<br>$V_{DD}$ (deselected) | 0 | 0 (selected)<br>$V_{PP}$ (deselected) |
| Bit line | $V_{DD}$ −1.5 V | 0 | $V_{PP}$ (selected)<br>0 (deselected) |
| Source select | 0 | 0 | $V_{PP}$ |
| Source | $V_{DD}$ | float | float |
| Memory N well | $V_{DD}$ | 0 | $V_{PP}$ |

FIG. 6 shows a layout of one embodiment of one of the memory cells shown schematically in FIG. 5 implemented in a typical non-self aligned double polycrystalline silicon process. Such processes are commonly used, for example, in the manufacture of mixed signal integrated circuits where they are employed for switched capacitor circuits.

FIG. 6 shows a top view of a cell 100 and FIGS. 6A and 6B show two cross sectional views through cell 100. There is an N well 103 in which an active region 102 lies. In the fabrication of a typical modem CMOS integrated circuit, the doping for the N wells and P wells is typically introduced into the substrate and then a thin layer of silicon dioxide topped with a layer of silicon nitride is formed on the wafer surface. Through a series of photolithographic and etching steps, the nitride is removed in the regions where it is desired to form a thick oxide that will serve to isolate active elements that are formed in the substrate, such as transistors, diffused interconnection regions, and resistors. After the selective nitride removal, thick field oxide 113 is grown. Field oxide is typically in the range 0.3 µm to 1.5 µm thick. The nitride blocks diffusion of the oxidizing species in the areas that remain covered. These covered regions are referred to as the active regions. The areas on which the thick oxide is grown may have the surface concentration of the dopant enhanced prior to oxidation to raise the threshold voltage of parasitic thick field transistors that will subsequently be inherently formed, as is known in the art.

After field oxide 113 is grown, the nitride is removed and a thin layer of silicon dioxide 129, typically in the thickness range of 10 nm to 100 nm, is formed. This oxide will serve as the gate oxide. In the case that a thin tunneling oxide is desired, the gate oxide is grown only partially. An operation involving photolithography and etching selectively removes the oxide from the regions that should have the thin oxide and the thin tunnel oxide 111 is then formed in these regions. While the thin oxide is formed in the tunneling regions, gate oxide 129 is thickened to the desired value. Tunnel oxide 111 is usually in the range of 5 nm to 20 nm in thickness. Polycrystalline silicon is then formed to a thickness in the range of 150 nm to 800 nm and doped. Lithographic and etching steps are used to form the polycrystalline silicon into the desired shapes. In FIG. 6, this first layer of polycrystalline silicon forms gate 104 of word line select transistor 64, gate 105 of memory transistor 62, and gate 108 of source select transistor 63. The first layer of polycrystalline silicon also may form capacitor plates, interconnects and resistors, if desired.

In a double layer polycrystalline silicon fabrication process, insulating layer 122, typically either silicon dioxide or a multi-layer sandwich of silicon dioxide/silicon nitride/silicon dioxide, is formed on the first layer of polycrystalline silicon. This layer is usually in the range of thickness of 20 nm to 100 nm. Then a second layer of polycrystalline silicon is deposited, doped and patterned. In FIGS. 6 and 6a, capacitor plate 107 is formed in this manner. After the second layer of polycrystalline silicon is patterned, source/drain regions 117 are implanted with the polycrystalline silicon gates serving as masks for protecting the channel regions.

Finally a layer of dielectric is formed and holes are selectively etched through it to allow contact to be made to the substrate diffusions and the polycrystalline silicon layers. In FIGS. 6, 6a and 6b, these contacts are shown with reference numerals 101, 106, 109 and 110. A layer of conductor, usually aluminum in the range of 0.5 to 1.5 µm thick, is deposited and patterned to form interconnections. This conducting layer is referred to as metal 1 in the balance of this description. In the cell of FIG. 6B, metal 1 is used to form bit line 116. The two metal layers 116 and 119 and inter-metal contact are omitted from the top view of FIG. 6 in the interests of clarity. Metal 1 is also used to form the connections for the source and source select. Source select trace 121 runs vertically in the top view of FIG. 6 and can also be seen in the cross section of FIG. 6A. The source connection also runs vertically in the top view. However, both the source select and the source connection are shared between two adjacent cells. The source select trace is seen in cross section in FIG. 6A, but the source connection is not seen because it runs in the adjacent cell. Metal 1 is also provided where it is desired to make a connection from a polycrystalline silicon layer or diffusion in the substrate to the second level of metal. An example of this is seen as metal 1 interconnect 112 in the cross section of FIG. 6A.

After the first layer of metal is deposited and patterned, another layer of dielectric is formed and holes are selectively etched to allow connections from the second layer of metal, metal 2, to the first layer of metal. One of these metal vias is shown as via 120 in the cross section of FIG. 6A. This layer of dielectric is typically 0.5 µm to 2.0 µm thick. Metal 2 is deposited and patterned to form interconnections, typically in the thickness range 0.5 µm to 2.0 µm. This layer is shown as layer 119 in the cross sections of FIGS. 6A and 6B. This trace is used to route the control line through the cell in the horizontal direction in FIG. 6.

As seen in the top view of FIG. 6, word line select transistor 64 is formed at the intersection of polycrystalline silicon trace 104 and active region 102, memory transistor 62 is formed at the intersection of polycrystalline silicon trace 105 and active region 102, and source select transistor 63 is formed at the intersection of polycrystalline silicon trace 108 and active region 102. Control capacitor 61 is formed by the overlap of polycrystalline silicon island 107 and polycrystalline silicon region 105. Word line 69-0 is routed through the cell in the horizontal direction by polycrystalline silicon trace 104.

It is to be understood that the process described here is just by way of example and not intended to limit the scope of the invention. The process can be modified in a number of ways by those with ordinary skill in the art, in light of the teachings of this invention. For example, select transistors 63 and 64 could be formed using the second layer of polycrystalline silicon as their gates.

Figure 7:
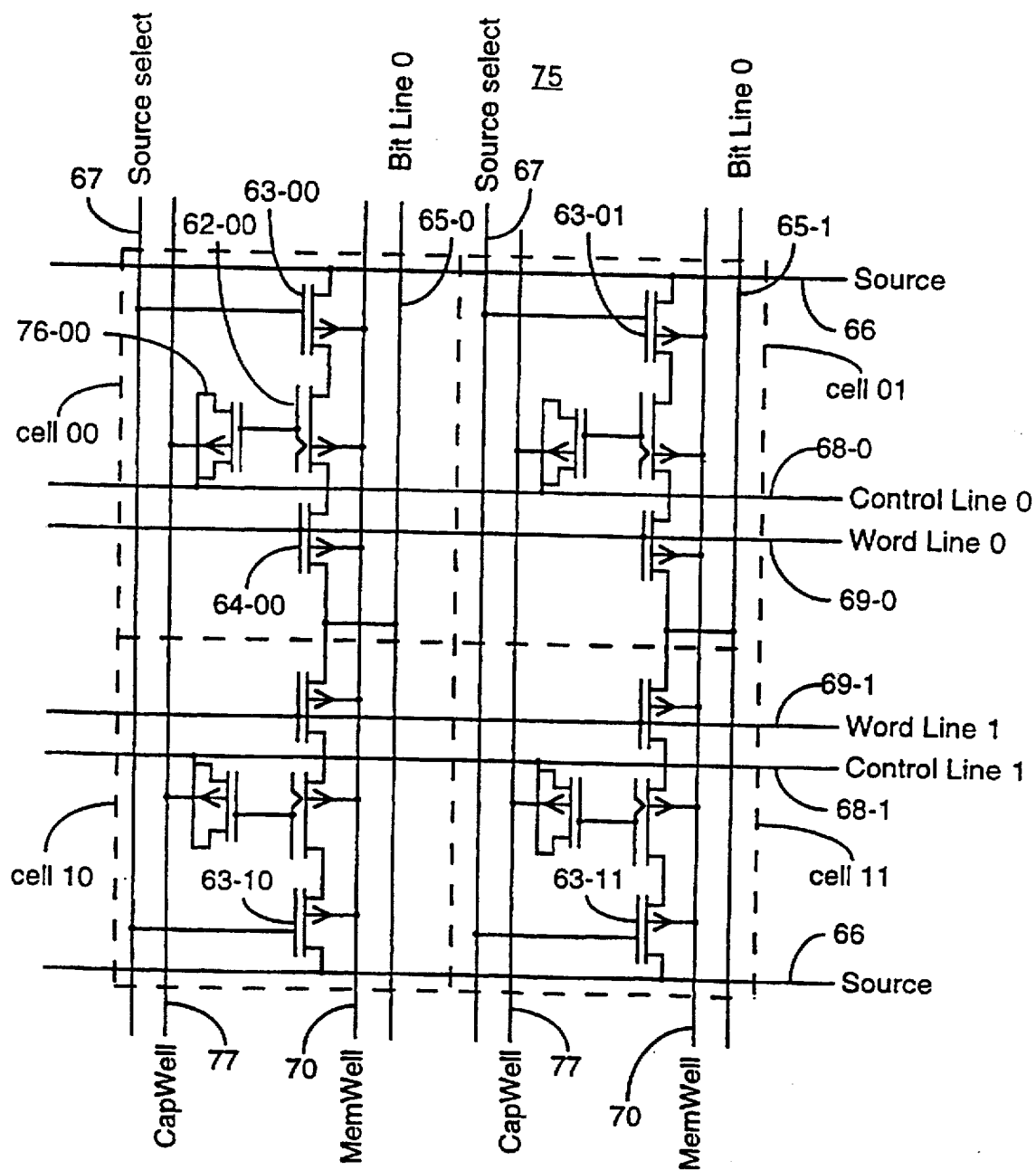
FIG. 7 is a schematic diagram of another embodiment of an array in accordance with the teachings of this invention.

In logic circuits and some mixed signal environments, only a single level of polycrystalline silicon is used. It is desirable, therefore, to design a cell that can be implemented in such a single poly process. FIG. 7 shows the schematic diagram of one embodiment of an array of cells that implements a P channel EEPROM in a single layer polycrystalline silicon environment in accordance with this invention. In this embodiment a P channel transistor with common source and drain 142 is used to implement the control capacitor.

In the read mode, the N wells are all biased at $V_{DD}$, the gates of the source select transistors 63-00 through 63-00 are grounded via line 67 and control lines 68-0 and 68-1 are biased at $V_{DD}$. In various alternative embodiments, each memory cell is contained in its own well region, or well regions are shared among a variety of cells along a word line, along a row line, or a group of cells spread over more than one row and/or word line. The selected word line, e.g. word line 69-0 when row 0 is selected, is biased at ground ($V_{SS}$) and the selected bit lines, 65-0 and 65-1 are typically biased at a moderate voltage (e.g. $V_{DD}$–1.5 V) to allow the state of the selected cells to be sensed. The unselected word lines are biased at $V_{DD}$ to isolate the unselected cells from the bit lines and the unselected bit lines are usually allowed to float to avoid current consumption in unselected columns. The unselected bit lines could be biased at $V_{DD}$ at the expense of extra circuitry. Of interest, the bit line must be biased at a value less than $V_{DD}$. The minimum value (i.e. the most negative value) is set by the requirement that the hot electron generation rate be low enough that it not disturb the cell. Since a conducting cell is programmed (i.e. charged negative), it is possible that the bit line could be biased at ground.

Table 2 shows the operational voltages of the array shown schematically in FIG. 7. As in the previous table, in the cases in which there are double entries the first value is associated with the unselected line.

TABLE 2

|  | Read | Program | Erase |
| --- | --- | --- | --- |
| Word line | 0 (selected) | 0 (selected) | 0 (selected) |
|  | $V_{DD}$ (deselected) | $V_{PP}$ (deselected) | $V_{PP}$ (deselected) |
| Bit Line | $V_{DD}$ – 1.5 V | 0 | $V_{PP}$ (selected) |
|  |  |  | 0 (deselected) |
| Source select | 0 | 0 | $V_{PP}$ |
| Source | $V_{DD}$ | float | float |
| Memory N well | $V_{DD}$ | 0 | $V_{PP}$ |

TABLE 2-continued

|  | Read | Program | Erase |
| --- | --- | --- | --- |
| Control line | $V_{DD}$ | $V_{PP}$ (selected) | 0 |
|  |  | 0 (deselected) |  |
| Capacitor well | $V_{DD}$ | $V_{PP}$ | 0 |

To program this array, memory wells containing the memory transistors and the select transistors are grounded via lines 70. The N wells containing capacitors 76-00 through 76-11 are biased at $V_{PP}$. Control line 68-0 for the selected row 0 is biased at $V_{PP}$ and the control lines of all the unselected rows are biased at ground. This capacitively couples a high voltage onto the floating gates of the memory cells contained in the selected row (or word). To emphasize the similarity with the embodiment of FIG. 5, those elements that are common to the two schematics are numbered similarly. Only those elements that differ, MOS capacitor 76 and capacitor wells 77, are numbered differently.

The control lines can be decoded to allow word wide programming as is known in the art and as was described for the typical prior art N channel array. Alternatively, for those applications in which word writeability is not required, the select transistors can be omitted to save space.

To erase cell 00 at row 0 bit line 0 of the array, memory N well line 70 is biased at $V_{PP}$, and capacitor wells 77 and control lines 68-0 and 68-1 are biased at ground. This holds the floating gates coupled to a low potential. The selected word line 69-0 is biased at ground and the unselected word line 69-1 is biased at $V_{PP}$. Then $V_{PP}$ is applied to the selected bit line 65-0 to erase the selected memory transistor. In one embodiment, all word lines and all bit lines are held at ground while the bias of the memory wells is increased to $V_{PP}$ in order to establish inversion layers at ground under the floating gates, so that the holes in these inversion layers will shield the floating gates from the fields that would otherwise be established to the memory wells. The unselected word lines are then be biased at $V_{PP}$ before $V_{PP}$ is applied to the selected bit lines to erase the selected cells.

Figure 8:
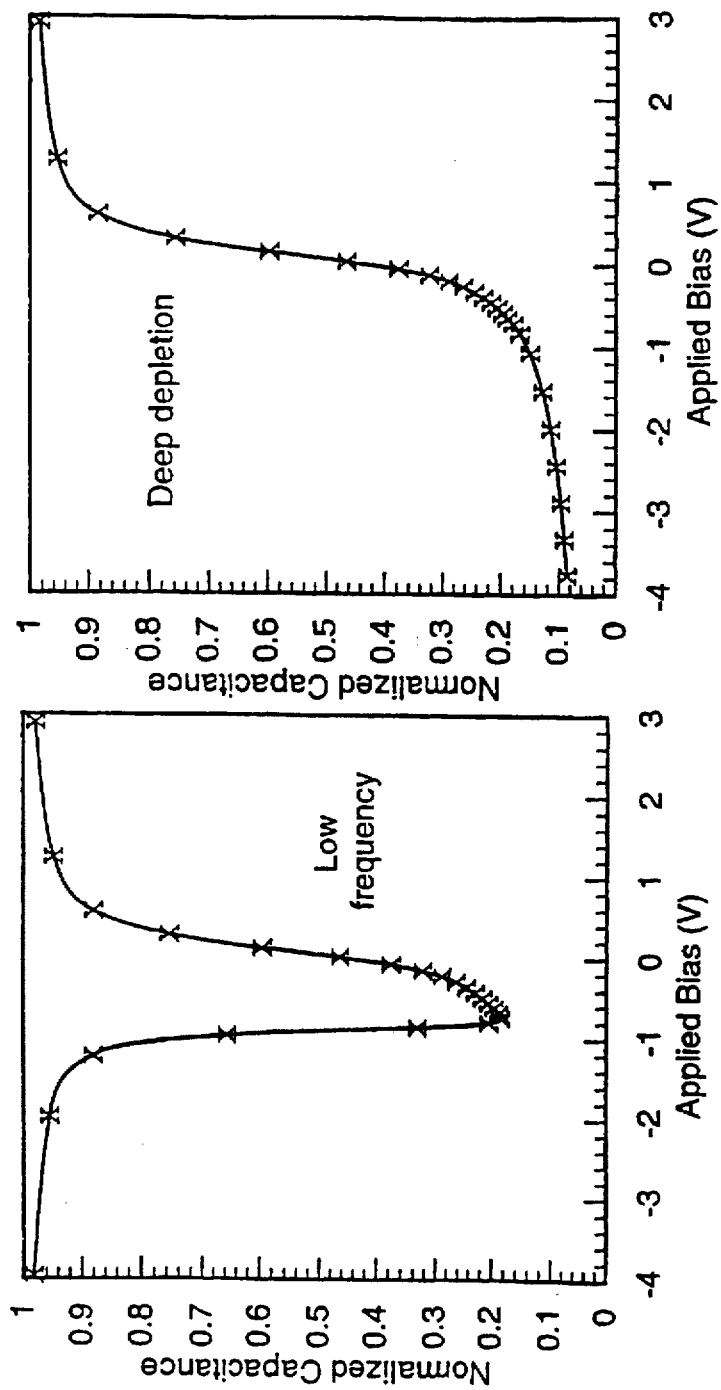
FIG. 8 shows plots of the dependence of the capacitance on the voltage applied to the gate for a MOS capacitor for the cases of equilibrium and deep depletion.

The behavior of the unselected rows during the programming mode requires some discussion. MOS capacitors with relatively lightly doped substrates are voltage variable (i.e. the capacitance depends upon the relative bias between the capacitor polycrystalline silicon gate and the capacitor body lying under the polycrystalline silicon). The capacitance also depends upon the bias on adjacent doped regions that may act as sources or sinks for mobile carriers. FIG. 8 shows the calculated capacitance as a function of potential between the capacitor body and the capacitor gate for a MOS capacitor with a N type body doped to $1 \times 10^{16}$ atoms/cm$^3$ and an oxide thickness of 200 Å. The capacitance is normalized to the capacitance of the oxide between two conductors. The curve labeled "Low frequency" is that which will occur when the capacitor has a source of holes to supply carriers for inversion. The curve labeled "Deep depletion" is that for the case in which there is no source of carriers available.

For both cases, biasing the body more than about a volt positive with respect the gate results in the capacitor being in accumulation (i.e. a layer of electrons from the capacitor body is "accumulated" near the oxide interface with the result that the capacitance will be nearly that of an oxide sandwiched between two conductors). As the bias is reduced the electrons are pushed away from the surface and a layer that is "depleted" of electrons is formed between the oxide an the mobile carriers in the body. This depletion layer appears as a capacitor in series with the oxide capacitance and the total series capacitance decreases. If there is a source of holes, they will be collected at the surface when the surface potential is low enough and the capacitance will be that between the layer of mobile holes and the polycrystalline silicon plate. This capacitance will approach that of the oxide at low enough bias. This is referred to as "inversion" because the surface behaves as if it were P type (i.e. as if the type of the surface is inverted). The case with inversion is called the low frequency case. If there is no source of mobile charge, the depletion layer becomes continuously wider and the capacitance continuously decreases. This is the deep depletion case.

If an unselected bit is programmed prior to the potential of the capacitor wells being increased to $V_{pp}$, there will be an inversion layer under the capacitor gate. This means that there will be a relatively large capacitance between the gate and the P+source/drain diffusion which is fixed at ground. Therefore, the voltage on the floating gate will not change because the capacitor plate is shielded from the changing well potential by the inversion layer. As the well becomes increasingly positive the inversion layer shrinks until it disappears and the capacitor goes into deep depletion. (The shrinkage of the inversion layer with increased reverse body bias is what leads to the increase in transistor threshold.) In deep depletion the gate is coupled the body, but, as is clear from FIG. 8, the capacitance is relatively small so the capacitive coupling to the floating gate is not increased in voltage by very much and there is not much voltage across the tunnel oxide for the programmed cells.

If, on the other hand, a cell is erased, there is initially an accumulation layer under the polycrystalline silicon gate if both control line and capacitor well are at ground. This accumulation capacitance will couple the floating gate up in voltage so there is real reason for concern that the unselected erased cells will be "disturbed" by electrons tunneling to the gate because of the potential across the tunnel oxide resulting from the coupling to the capacitor well. The final voltage across the tunnel oxide of the unselected erased cell resulting from the well bias depends upon its original potential before the well bias is increased. The more positive the original voltage on the unselected erased floating gate, the larger the final oxide field.

It is illustrative to work through an example to see how this happens. Let us assume that the coupling ratio of the MOS capacitor to the floating gate is 0.8 when the capacitor is strongly accumulated (i.e. that the floating gate voltage changes 0.8 V for every change of 1 V on the well). We assume that the transition from accumulation to inversion occurs when the gate is 0.3 V more positive than the body and that the transition from depletion to inversion occurs when the gate is –0.7 V more negative than the body. This is the case illustrated in FIG. 8 and is a fairly typical set of numbers. It is assumed that the floating gate is initially at +1 V and the well and source/drain diffusions (control line) are at ground. As the well increases in voltage, the floating gate voltage also increases, but more slowly. For simplicity in this illustration, it is assumed that the MOS capacitor has the oxide capacitance until the gate/body difference reaches the 0.3 V accumulation threshold and then decreases to 10% of that value. Since the source/drain are maintained at ground, there is no source of holes and the capacitance curve will follow the deep depletion case. This is a crude, but reasonably accurate, approximation.

The accumulation threshold is attained at the well bias given by $$V_{init} - V_{accum} = (1 - \text{coupling\_ratio}) V_{n-well}$$

Evaluating this expression shows that the accumulation threshold is reached when the N well voltage is 3.5 V. For N well voltages greater than this, the coupling ratio is reduced to ⅒. If $V_{pp}$ is chosen to be 11 V, the final floating gate voltage for this unselected erased cell is 6.3 V. This is high enough that there could be a small amount of tunneling over many cycles. Fortunately, the maximum voltage across the tunnel oxide decreases much faster than the initial voltage. If we assume that after some large number of programming events on other cells in the array the initial voltage is decreased by 0.1 v to 0.9 V, the same calculation shows that the final floating gate voltage is 6 V. Because the Fowler-Nordheim current decreases exponentially with the voltage applied across the tunnel oxide, this decrease in voltage will decrease the disturb current by almost an order of magnitude.

More detailed analysis shows that the final voltage on the floating gate depends strongly on the initial floating gate voltage and that the final voltage changes much more rapidly than the initial voltage for those initial floating gate voltages in the range that the final voltage is not limited by tunneling. Even if tunneling occurs, only a small amount of charge is transferred prior to reducing the floating gate potential to a level where tunneling current is substantially decreased, because of the small total capacitance of the floating gate with the control capacitor in depletion ($\Delta Q = C \Delta V$). Therefore, the disturb tends to be self limiting; enough charge will be transferred to lower the potential on the erased gate to the point that the disturb is insignificant. The initial potential at which the disturb becomes insignificant is that about equal to the onset of depletion (e.g. about +0.5 V for the case illustrated here.)

Because this cell has a row select transistor, it will operate quite well with a programmed voltage as low as the transistor inversion (conduction) threshold voltage, e.g. –0.7 V. To avoid significant disturb, the initial programmed level can be controlled by periodically interrupting the program function and monitoring the maximum program voltage in ways well known in the art, such as is described in V. N. Kynette et al., "An In-system Reprogrammable 256 k CMOS Flash Memory", ISSCC Digest, 1988 pp. 132-3. If the maximum threshold level is set to not exceed +1 V, the cell can easily tolerate a range of programmed bits of 1 V. If the array is programmed a word at a time, this tolerance is relatively easy to maintain. Even for an array that is to be programmed a row at a time, this tolerance is very reasonable for small arrays.

Figure 9:
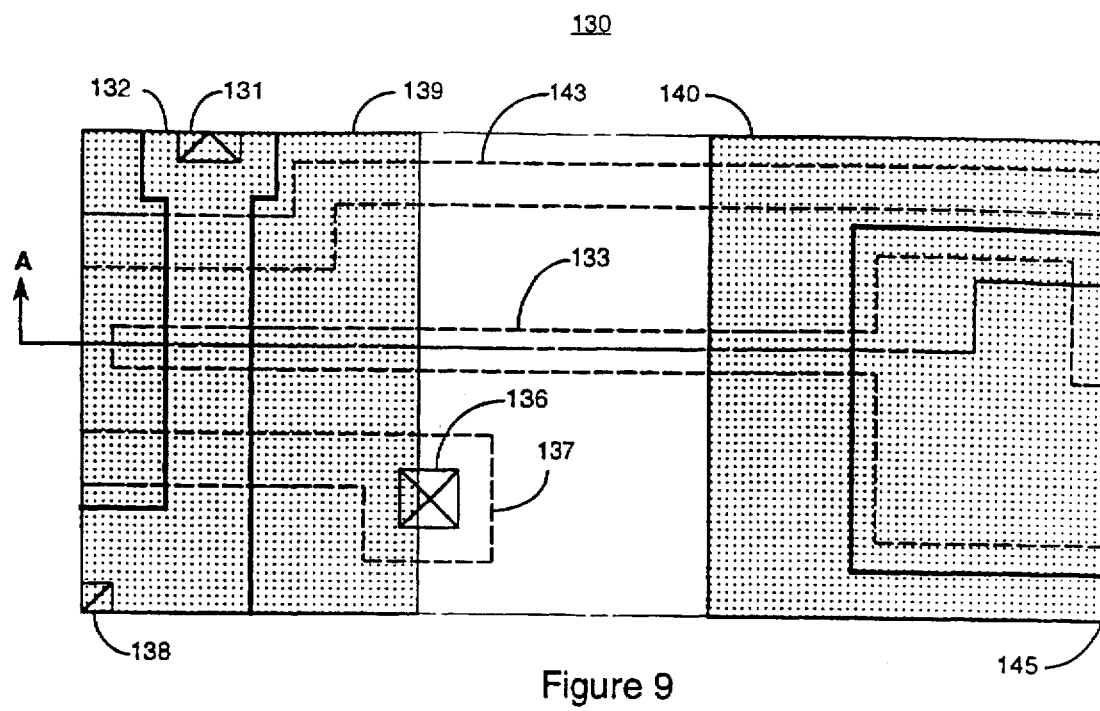
FIG. 9 is a top view and FIG. 9a is a cross section view showing one embodiment of a single one of the memory cells shown schematically in FIG. 7.
Figure 9A:
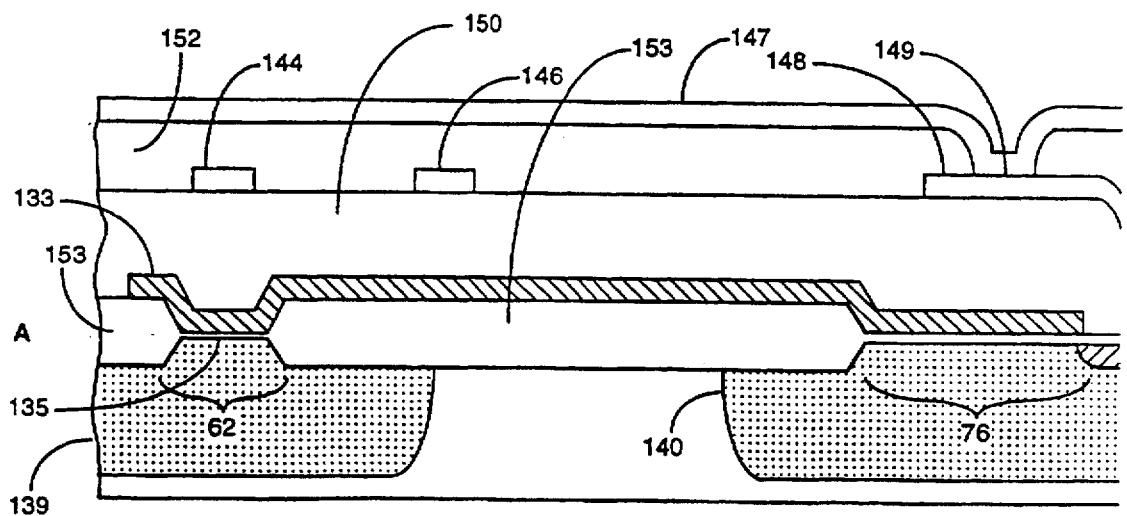

FIG. 9 shows the top view of one embodiment of a memory cell of this invention laid out in accordance with the schematic diagram shown in FIG. 7. FIG. 9A shows a cross section through the cell in the horizontal direction. A vertical cross section through the memory transistor is the same as is shown in FIG. 6B. This cell is laid out in a single poly, double metal process. This is an N well process fabricated in a P-type substrate 151 in which the N wells for the memory and select transistors 139 and the control capacitors 140 are embedded. Polysilicon layer 133 forms the gate of memory transistor 62 and the gate of MOS control capacitor 76. The polysilicon trace 137 forms the gate for the source select transistor for both this cell and for the adjacent cell (not shown). The polysilicon trace 143 forms the word select gate for the cell and also routes the word line through the array. The metal 1 line 144 forms the bit line and contacts the drain of the word select transistor at the contact 131. This line, and all of the other metal lines and intermetal vias, are omitted from the top view in the interest of clarity. This metal line 146 serves as the source select line and connects the gate of the source select transistor at the contact 136. The bottom plate of the control capacitor 76 is formed in the active region 145 where the polysilicon overlaps the capacitor N-well 140. The P+diffusion 142 surrounds the capacitor everywhere that the polysilicon doesn't overlap the active region. This polysilicon layer provides a source of holes under the correct bias conditions as discussed previously. Control line 147 runs through the cell horizontally and contacts the P+diffusion 142 through the intermediary of metal 1 line 148 and internal via 148. Regions of thick field oxide 153, typically 0.3 to 1.2 μm thick, define the boundaries of the active regions and cause the parasitic field transistors to have high enough thresholds that they do not conduct. The thickness of the field oxide also serves to reduce the capacitance of the floating gate over the field regions. A relatively thick, typically 0.5 μm to 1.5 μm thick, dielectric layer 150 separates metal 1 layer from the polysilicon layer. Another relatively thick, typically 0.7 μm to 2.0 μm thick, dielectric layer 152 separates the metal 2 layer from the metal 1 layer.

Figure 10:
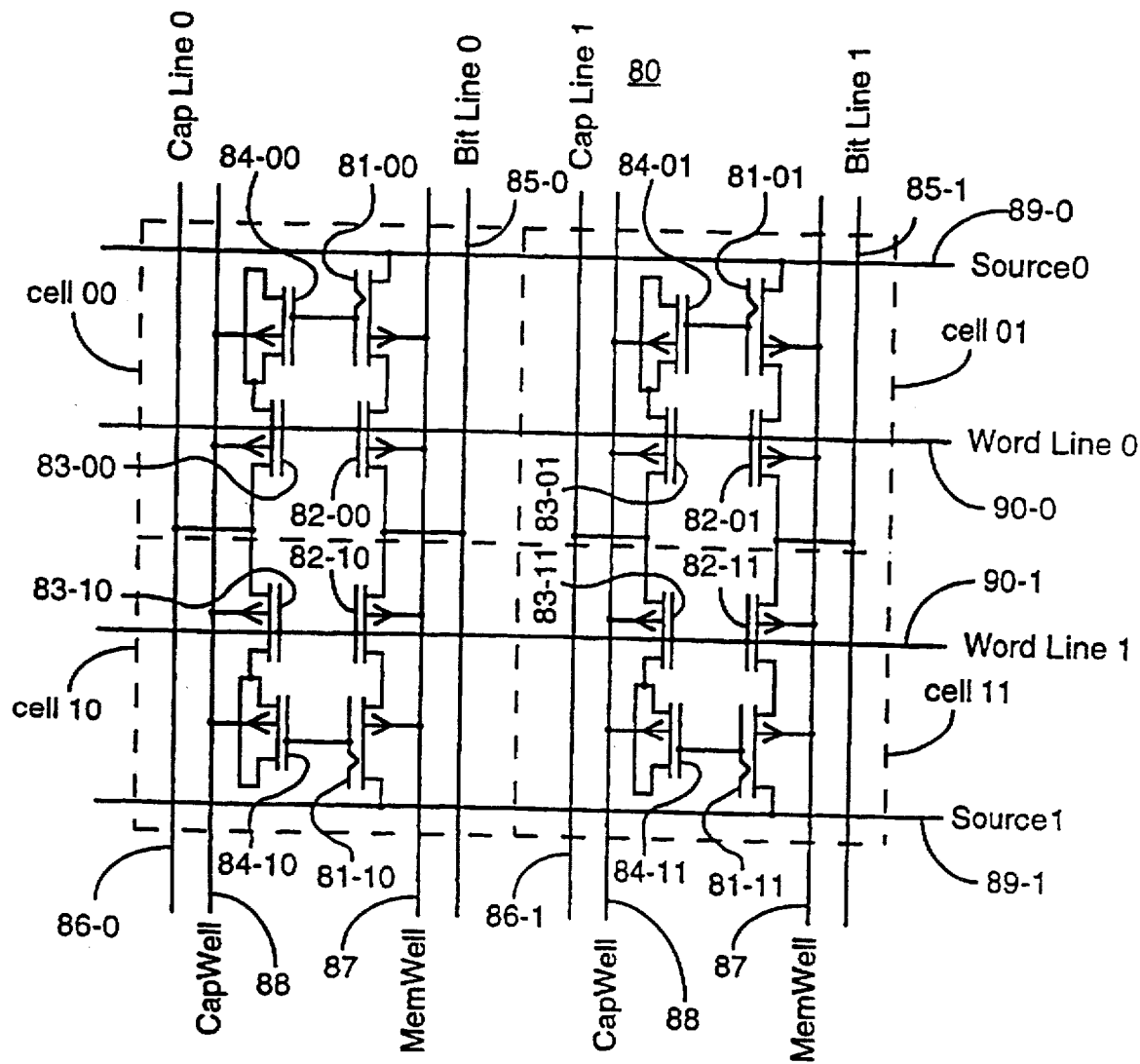
FIG. 10 is a schematic diagram of an array of another embodiment of this invention that uses two layers of polysilicon for the control capacitor.

Another approach to avoiding direct current during writing to the cells is illustrated schematically in FIG. 10. In this cell source select transistors are omitted and in their stead are placed transistors 83-00 through 83-11 having their gates connected to their respective row lines to provide selection of the control line capacitors 84-00 through 84-11. This embodiment operates by erasing all of the bits in a word and then selectively programming memory cells in that word to establish a desired bit pattern, as described in Table 3.

TABLE 3

|  | Read | Program | Erase |
|---|---|---|---|
| Word line | 0 (selected) | 0 (selected) | 0 (selected) |
|  | $V_{DD}$ (deselected) | $V_{PP}$ (deselected) | $V_{PP}$ (deselected) |
| Bit Line | $V_{DD}$ − 1.5 V | 0 | $V_{PP}$ |
| Source select | 0 | 0 | $V_{PP}$ |
| Source | $V_{DD}$ | float | float |
| Memory N well | $V_{DD}$ | 0 | $V_{PP}$ |
| Control line | $V_{DD}$ | $V_{PP}$ (selected) | 0 |
|  |  | 0 (deselected) |  |
| Capacitor well | $V_{DD}$ | $V_{PP}$ | 0 |

During read mode, all of the N wells are biased at $V_{DD}$, as are the capacitor control lines. The selected row line is biased at ground and the unselected row lines are biased at $V_{DD}$. A moderate voltage (e.g. 2 V) is applied to the selected bit lines to sense the state of the selected cells while the unselected bit lines float, as with the cell shown in FIG. 7. The source lines are biased at $V_{DD}$ in the read mode.

To erase a word, all the memory array N wells for the word selected are biased at $V_{PP}$ and all the capacitor N wells for the word selected are biased at ground. The selected row line is biased at ground and the unselected row lines are biased at $V_{PP}$. (As with the cell shown in FIG. 7, the cells and control capacitors are all precharged to ground at the beginning of an erase cycle.) The source lines are allowed to float, but to erase a word at a time it is necessary to decode the source lines just as the row select lines are decoded in the prior art N channel array discussed previously. The source decoding is not needed if the application doesn't require word writeability.

To selectively program bits within a word, all of the memory wells 87 for the selected word are biased at ground and all of the capacitor wells 88 for the selected word are biased at $V_{PP}$. Word lines 90 and bit lines 85 are all biased at ground while the bias on the capacitor wells 88 is increased to $V_{PP}$. This prevents the well bias from coupling the floating gates on the unselected rows to such a high voltage that significant tunneling occurs on the cells on the unselected words. Once this set of biases is established, the unselected word lines are biased at $V_{PP}$ to isolate the memory transistors and the control capacitors on the unselected word lines. The capacitor control lines of the bits to be programmed are then biased to $V_{PP}$. This couples the selected floating gates to a high voltage and tunneling occurs across the thin oxides to program the selected cells. The disturb discussion that applied to the cell shown schematically in FIG. 7 applies to this cell also.

Figures 11, 11A:
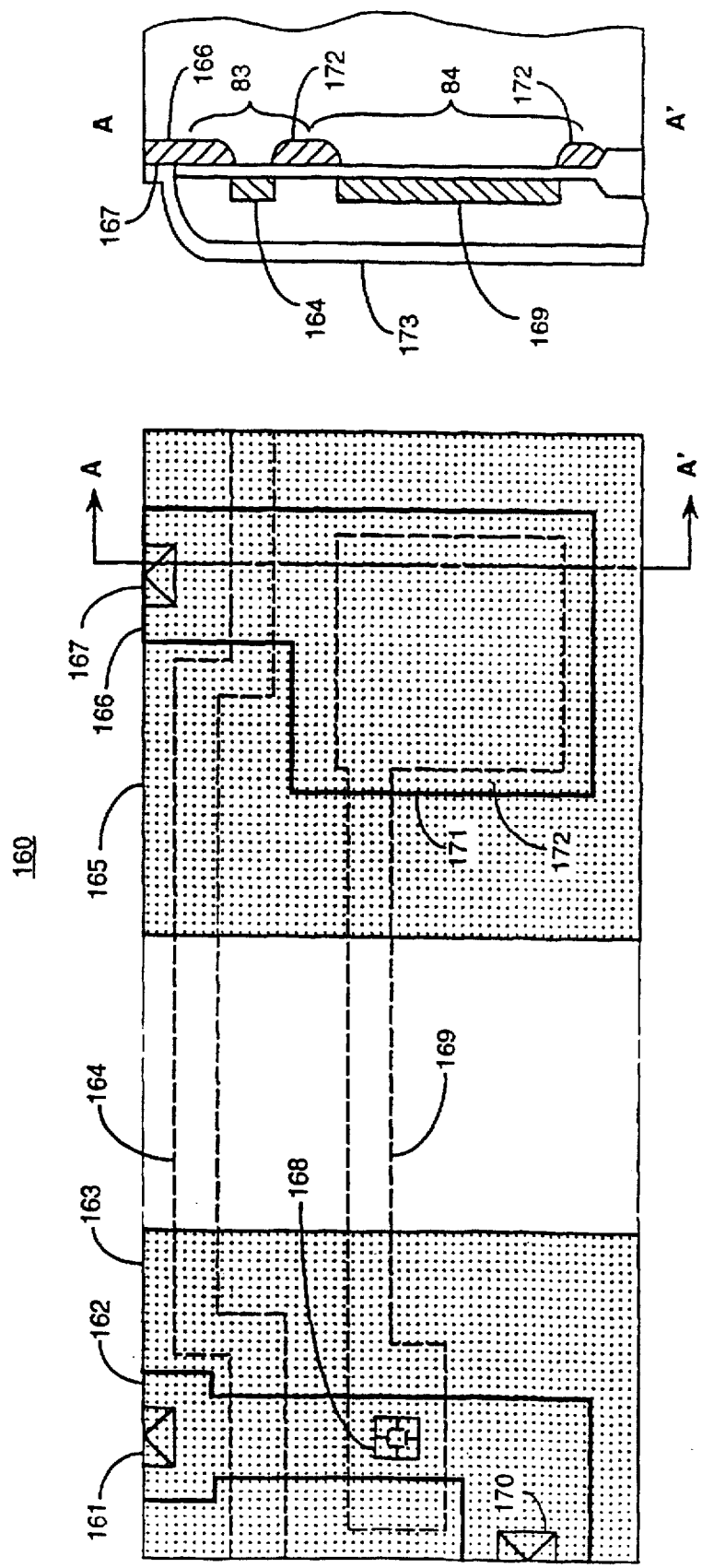
FIG. 11 is a top view and FIG. 11a is a cross section view showing one embodiment of a single one of the memory cells shown schematically in FIG. 10.

FIG. 11 shows one embodiment of a layout that implements this approach to the P channel EEPROM cell. As in the cell layout shown in FIG. 9, row line 164 is a horizontal trace that forms in this case both the select transistor 83 for both the capacitor 84 and the select transistor 82 memory transistor 81. Bit lines 85 and capacitor control lines 86 (FIG. 10) are routed vertically in metal 1. The metal 1 capacitor control line is seen as trace 173 in FIG. 11A. The source lines are routed horizontally in metal 2, not shown. As in FIG. 9, the metal layers and the metal vias are omitted from the top view in the interest of clarity.

Figure 12:
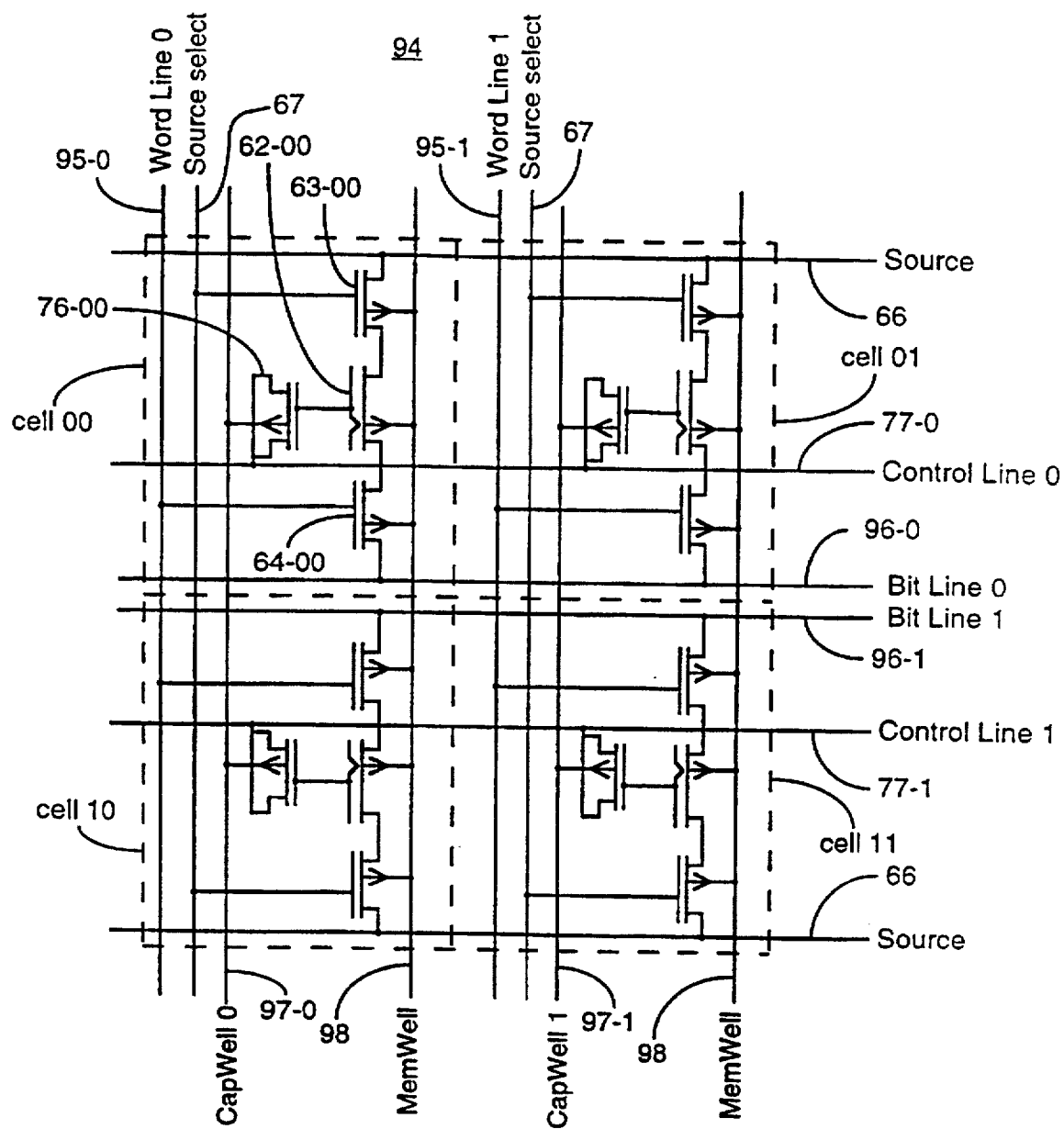
FIG. 12 is a schematic diagram of an alternative embodiment of an array of cells in accordance with the teachings of this invention.

Although calculation shows that the cells shown schematically in FIG. 7 and FIG. 10 can be designed so that the disturbs inherent in the layout are acceptable, it is of interest to design cells that are inherently even less susceptible to disturbs. FIG. 12 shows schematically one such memory cell. Comparison of FIG. 7 and FIG. 12 shows that the embodiment of FIG. 12 differs from the embodiment of FIG. 7 in that the word lines 95-0 and 95-1 run parallel to the well lines and bit lines 96-0 and 96-1 run perpendicular to the well lines. The significance of this is that during programming only one capacitor well line (e.g. well line 97-0) must be biased to $V_{PP}$. The remainder of the well lines (e.g. well line 97-1, i.e. the unselected wells) remain at ground so that the cells capacitively coupled to the unselected capacitor well see no disturb voltage. If the whole row is programmed together or if the wells for individual words are decoded, no cells experience the disturb condition. If only one word in a row with undecoded capacitor N well is to be programmed, the other cells in the row will experience the disturb condition, but cells will be disturbed many fewer times than in the case that programming any cell produces disturb conditions. The operation is described in Table 4.

TABLE 4

|  | Read | Program | Erase |
|---|---|---|---|
| Word line | 0 (selected) | 0 (selected) | 0 (selected) |
|  | $V_{DD}$ (deselected) | $V_{PP}$ (deselected) | $V_{PP}$ (deselected) |
| Bit Line | $V_{DD}$ − 1.5 V | 0 | $V_{PP}$ (selected) |
|  |  |  | 0 (deselected) |
| Source | $V_{DD}$ | float | float |
| Memory N well | $V_{DD}$ | 0 (selected) | $V_{PP}$ |
|  |  | 0 to 3 volts (deselected) |  |
| Control line | $V_{DD}$ | $V_{PP}$ (selected) | 0 |
|  |  | 0 (deselected) |  |
| Capacitor well | $V_{DD}$ | $V_{PP}$ (selected) | 0 |
|  |  | 0 (deselected) |  |

Figure 13:
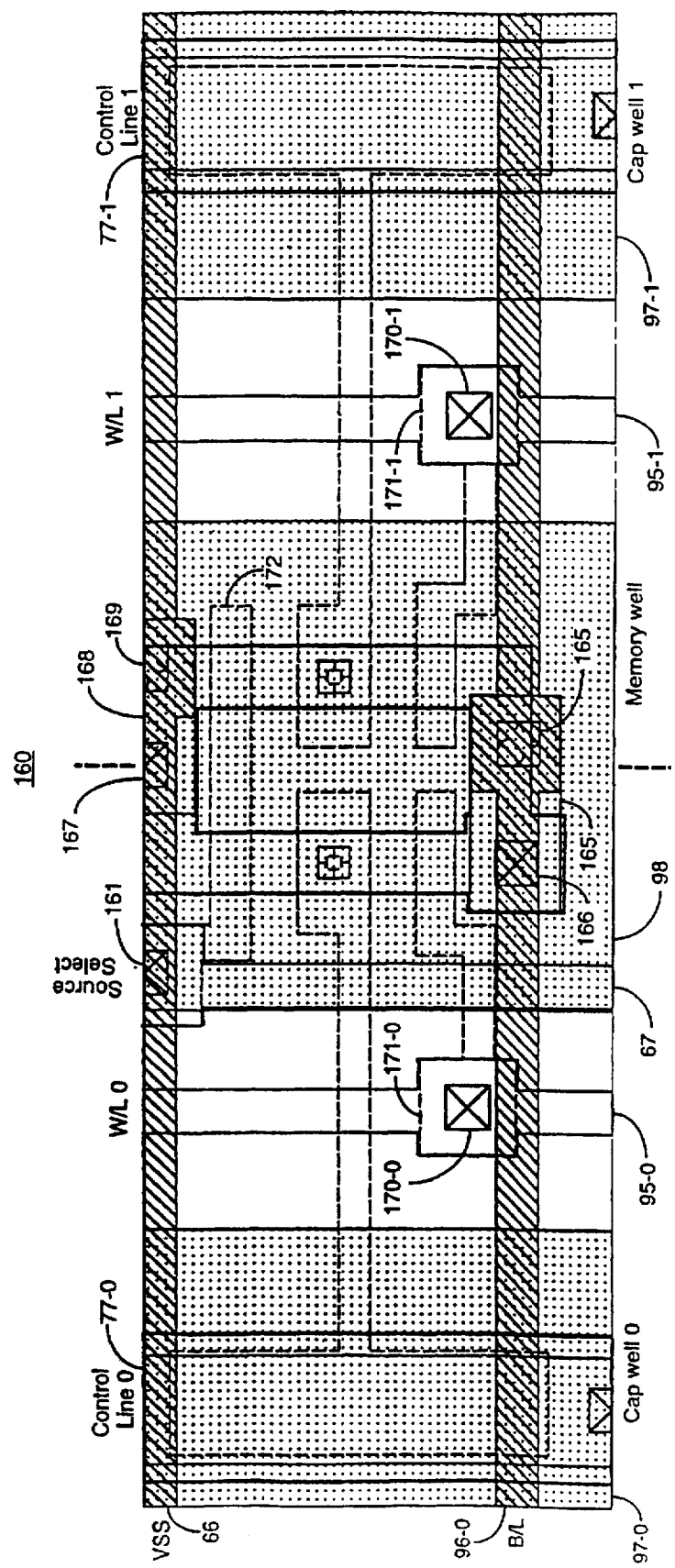
FIG. 13 is a top view showing the layout of one embodiment of a block of two cells illustrating the schematic diagram of FIG. 12.

One embodiment of layout of two cells that implements the embodiment of FIG. 12 is shown in FIG. 13. The two cells lie to the left and right of the bold dashed vertical line appearing in FIG. 13. In this layout capacitor N wells 97-0 and 97-1 are shared between two adjacent memory rows in order to reduce cell area although this is not required. The disturb condition on the adjacent row can be minimized by biasing the memory well for this row to a small positive voltage (e.g. 2 V to 3 V). This will reduce the disturb condition by an equivalent amount. The operation of this cell is the same as that of the cell shown in FIG. 7 except for the decoding of the capacitor N wells. In the cell embodiment in FIG. 13, if the memory cells on word line 95-0 are to be programmed, capacitor well line 97-0 is biased at $V_{PP}$, but capacitor well line 97-1 and all other capacitor wells remain biased at ground, which removes the possibility of disturbing cells selected by word line 95-1 and all other such word lines.

The cost of the minimization of the disturb conditions is that the cell area is increased because there must now be space in the vertical direction for two contacts in separate diffusions where in FIG. 9 the contact was shared. This is seen in FIG. 13 where contact 166 provides a connection from bit line 96-0 to the memory transistors selected by the two word select transistors whose gates are formed by the polysilicon traces 171-0 and 171-1. The connection from the bit line running in metal 2 to the diffusion is mediated through the metal 1 island 165 and the metal 1 to metal 2 via 165. The active area in which contact 166 is located must be spaced apart from that in the cells that would be formed from a vertical mirror image of the cells shown. This increase in layout area caused by this additional spacing that is required in the embodiment of FIG. 13 and not in the embodiment of FIG. 9 is about 20% per cell. The operation of this embodiment is shown in Table 5.

Figure 14:
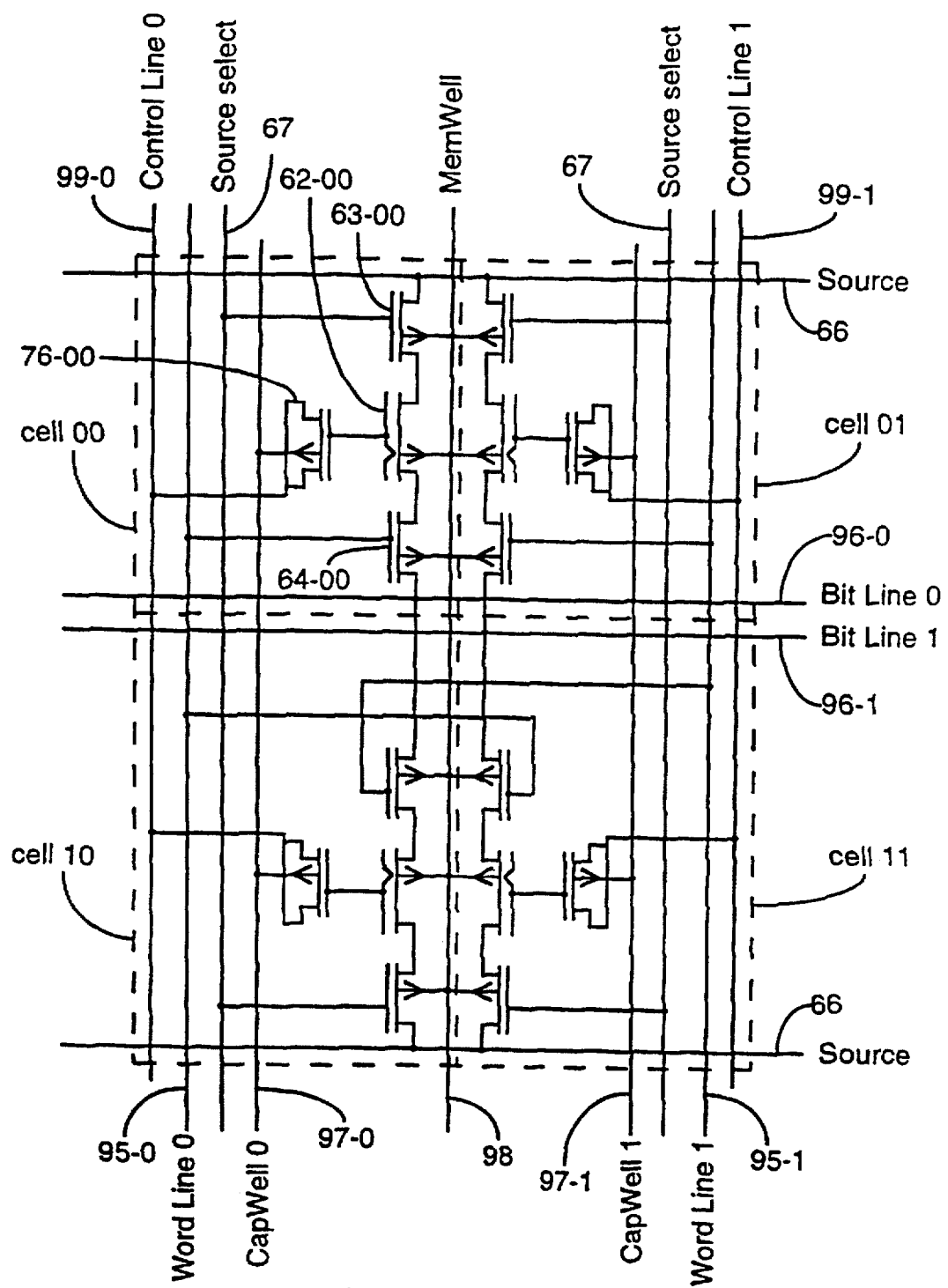
FIG. 14 is a schematic diagram of another embodiment of an array of cells in accordance with the teachings of this invention.

FIG. 14 shows schematically one embodiment of an array of cells that achieves the minimization of the disturb that was achieved in the embodiment of FIG. 12 yet occupies essentially the same area as the embodiment of in FIG. 7. This is made possible by using crisscrossed word lines 95. During the read mode and the erase mode the capacitor control lines are all at the same potential, so the consequences of the crisscross are immaterial. All that matters is that the cells selected are unique.

TABLE 5

| | Read | Program | Erase |
|---|---|---|---|
| Word line | 0 (selected) | 0 (2 adjacent) | 0 (selected) |
| | $V_{DD}$ (deselected) | | $V_{PP}$ (deselected) |
| Bit Line | $V_{DD}$ – 1.5 V | 0 | $V_{PP}$ (selected) |
| | | | 0 (deselected) |
| Source select | 0 | 0 | $V_{PP}$ |
| Source | $V_{DD}$ | float | float |
| Memory N well | $V_{DD}$ | 0 | $V_{PP}$ |
| Control line | $V_{DD}$ | $V_{PP}$ (2 adjacent-selected) | 0 |
| | | 0 (deselected) | |
| Capacitor well | $V_{DD}$ | $V_{PP}$ (2 adjacent-selected) | 0 |
| | | 0 (deselected) | |

During the programming mode, the crisscross of the word lines across the memory transistor well effects the programming. There are two methods is which this array can be operated. In one method, two adjacent words in the same memory well are programmed at the same time by applying $V_{PP}$ to the two adjacent capacitor wells and control nodes. In this method, the word lines are operated as two independent interlaced word lines in the read and erase modes. In a second method, only the adjacent cells in the common memory well are treated as one word that must be accessed in an upper half/lower half mode during erasing and reading.

The operation of this embodiment is shown in Table 6.

TABLE 6

| | Read | Program | Erase |
|---|---|---|---|
| Word line | 0 (selected) | 0 | 0 (selected) |
| | $V_{DD}$ (deselected) | | $V_{PP}$ (deselected) |
| Bit Line | $V_{DD}$ – 1.5 V | 0 | $V_{PP}$ (deselected) |
| | | | 0 (selected) |
| Source select | 0 | 0 | $V_{PP}$ |
| Source | $V_{DD}$ | float | float |
| Memory N well | $V_{DD}$ | 0 | $V_{PP}$ |
| Control line | $V_{DD}$ | $V_{PP}$ (selected) | 0 |
| | | 0 (deselected) | |
| Capacitor well | $V_{DD}$ | $V_{PP}$ | 0 |

What this means is that the two adjacent capacitor rows are biased to $V_{PP}$ to program all of the adjacent cells in the memory well e.g. lines 99-0, 95-0, 99-1, and 95-0 are all biased to $V_{PP}$ simultaneously. During erasing and reading, first one word line 95-0 selects one half of the word and connects it to the bit lines 96 and then in a sequential operation, the other word line 95-1 connects the other half of the word to the bit lines 96. This form of operation is actually commonly used in devices with multiplexed data buses (e.g. the 8088 microprocessor).

Figure 15:
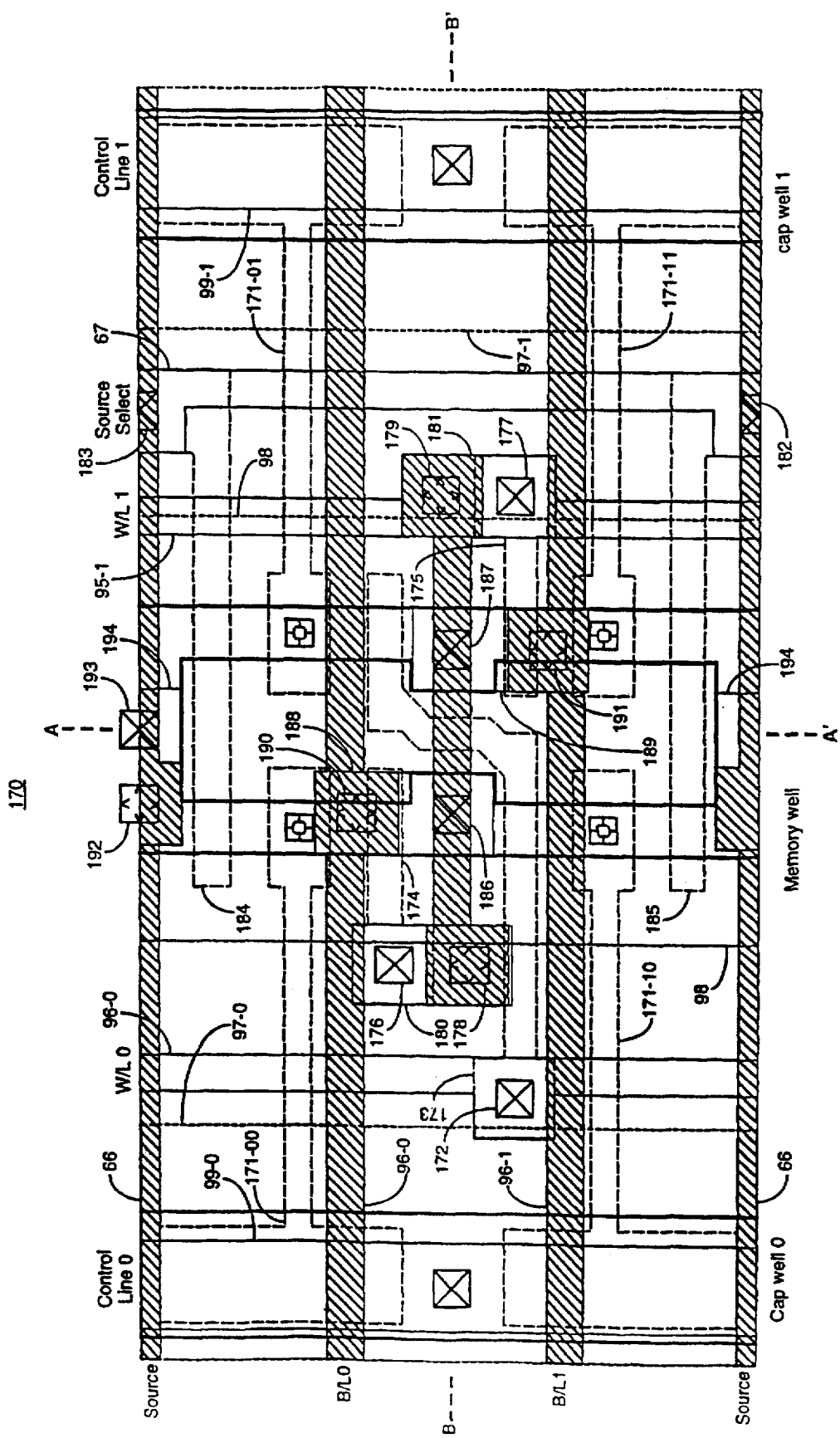
FIG. 15 is a top view showing the layout of one embodiment of a block of four cells illustrating the schematic diagram of FIG. 14.

FIG. 15 shows the top view of a block of one embodiment of four cells laid out in conformance to the embodiment of in FIG. 14. The four quadrants formed by lines extended between the bold dashed line pairs A-A' and B-B' correspond to the four cells shown in FIG. 14. Thus the polysilicon traces 171-00 forms the gates of the memory transistor 62-00 and the MOS capacitor 76-00. One of the crisscrossed select gates in FIG. 15 is fairly easy to see. The polysilicon trace 173 which is connect to word line 96-0 by the contact 172 forms the select gate for the cells labeled 01 and 10 in FIG. 14. The word select gates for other two cells 00 and 11 are formed by the polysilicon traces 174 and 175, respectively. The gate electrode for cell 11 is connected to the word line 95-1 directly through the contact 177. The connection for the select gate for the cell 00 is less direct. The metal 1 line 95-1 is connected by via 179 to the metal two trace 181 through the via 179. Via 178 connects metal 2 trace 181 to metal two trace 181 through the via 179. Via 178 connects metal 2 trace 181 to metal 1 trace 180 which ultimately connects to the polysilicon trace 174 through contact 176. The metal 2 traces are shown as cross hatched areas in FIG. 15.

The source lines 66 run through the array horizontally in metal 2 and connect to the active regions of the cells through the mediation of via 192, metal 1 trace 194 and contact 193. These three elements are shared between adjacent cells. Thus the contact and via extend beyond the source line at the top by the amount that they extend into the cell at the bottom. Bit lines 96-0 and 96-1 also run horizontally through the array in metal 2. Bit line contacts 186 and 187 to the active areas area buried under metal 2 trace 181 and accessed by means of metal 1 regions 188 and 189 and vias 190 and 191. N well regions 97-0, 97-1 and 98 are indicated by the lines with short dashes.

Control lines 99-0 and 99-1 are routed through the array in metal 1 traces as is source select line 67. The contacts for the control lines lie between the control capacitors that share the same well. The source select line connects to two polysilicon traces 184 and 185 that form the gates of the source select transistors at half contacts 182 and 183. Polysilicon traces 184 and 185 are each one half of a piece of polysilicon that forms the select transistor gates for four adjacent cells.

What is claimed:

1. An EEPROM cell comprising;
   a P channel memory transistor formed in a memory well, said memory transistor comprising a source, a drain, and a floating gate;
   a source line;
   a source select line;
   a word line;
   a control line;
   a bit line;
   a source select transistor connected between said source of said memory transistor and said source line, and having a source select control gate connected to said source select line;
   an access transistor connected between said drain of said memory transistor and said bit line, and having a control gate connected to said word line;
   a capacitor coupling between said control line and said floating gate of said memory transistor.

2. An EEPROM cell as in claim 1 wherein said capacitor comprises an MOS transistor having its control gate serving as a first capacitor plate and coupled to said floating gate of said memory transistor, and one or more source/drain regions serving as a second capacitor plate and being coupled to said control line.

3. An EEPROM cell comprising;
   a P channel memory transistor formed in a memory well, said memory transistor comprising a source, a drain, and a floating gate;
   a source line;
   a word line;
   a capacitor line;
   a bit line;
   a capacitor comprising an MOS transistor having its control gate serving as a first plate coupled to said floating gate of said memory transistor and one or more source/drain regions serving as a second plate;
   a transistor connected between said second plate of said capacitor and said capacitor line, and having a control gate connected to said word line;
   an access transistor connected between said drain of said memory transistor and said bit line, and having a control gate connected to said word line.

4. A memory array arranged in a plurality of N rows and a plurality of M columns;
   a plurality of source lines;
   a plurality of N word lines;
   a plurality of source select lines;
   a plurality of control lines;
   a plurality of M bit lines; and
   a plurality of N×M EEPROM cells, each uniquely associated with one of said rows and one of said columns, each of said EEPROM cells comprising:
   a P channel memory transistor formed in a memory well, said memory transistor comprising a source, a drain, and a floating gate;
   a source select transistor connected between said source of said memory transistor and said source line, and having a source select control gate connected to said source select line;
   an access transistor connected between said drain of said memory transistor and said bit line, and having a control gate connected to said word line; and
   a capacitor coupling between said control line and said floating gate of said memory transistor.

5. A memory array as in claim 4, wherein each of said capacitors comprises an MOS transistor having its control gate serving as a first capacitor plate and connected to said floating gate of its associated memory transistor, and one or more source/drain regions serving as a second capacitor plate and being coupled to associated one of said control lines.

6. A memory array arranged in a plurality of N rows and a plurality of M columns;
   a plurality of N source lines;
   a plurality of N word lines;
   a plurality of M capacitor select lines;
   a plurality of M bit lines; and
   a plurality of N×M EEPROM cells, each uniquely associated with one of said rows and one of said columns, each of said EEPROM cells comprising:
   a P channel memory transistor formed in a memory well, said memory transistor comprising a source, a drain, and a floating gate;
   a capacitor comprising an MOS transistor having its control gate serving as a first plate coupled to said floating gate of said memory transistor, and one or more source/drain regions serving as a second plate;
   a transistor connected between said second plate of said capacitor an associated one of said capacitor lines, and having a capacitor select control gate connected to an associated one of said word lines;
   an access transistor connected between said drain of said memory transistor and an associated one of said bit lines, and having a control gate connected to said associated one of said word lines.

7. A memory array arranged in a plurality of N rows and a plurality of M columns;
   a plurality of source lines;
   a plurality of N word lines;
   a plurality of source select lines;
   a plurality of control lines;
   a plurality of M bit lines; and
   a plurality of N×M EEPROM cells, each uniquely associated with one of said rows and one of said columns, each of said EEPROM cells comprising:
   a P channel memory transistor formed in a memory well, said memory transistor comprising a source, a drain, and a floating gate;
   a source select transistor connected between said source of said memory transistor and an associated one of said source lines, and having a source select control gate connected to an associated one of said source select lines;
   an access transistor connected between said drain of said memory transistor and an associated one of said bit lines, and having a control gate connected to an associated one of said word lines; and
   a capacitor coupling between said associated one of said control lines and said floating gate of said memory transistor.

8. A memory array as in claim 7, wherein each of said capacitors comprises an MOS transistor having its control gate serving as a first capacitor plate and coupled to said floating gate of its associated memory transistor, and one or more source/drain regions serving as a second capacitor plate and being coupled to said associated one of said control lines.

9. A memory array arranged in a plurality of N rows and a plurality of M columns;
- a plurality of source lines;
- a plurality of N word lines;
- a plurality of source select lines;
- a plurality of control lines;
- a plurality of M bit lines; and
- a plurality of N×M EEPROM cells, each uniquely associated with one of said rows and one of said columns, each of said EEPROM cells comprising:
  - a P channel memory transistor formed in a memory well, said memory transistor comprising a source, a drain, and a floating gate;
  - a source select transistor connected between said source of said memory transistor and an associated one of said source lines, and having a source select control gate connected to an associated one of said source select lines;
  - an access transistor connected between said drain of said memory transistor and an associated one of said bit lines, and having a control gate connected to an associated one of said word lines; and
  - a capacitor coupling between said associated one of said control lines and said floating gate of said memory transistor.

10. A memory array as in claim 9, wherein each of said capacitors comprises an MOS transistor having its control gate serving as a first capacitor plate and coupled to said floating gate of its associated memory transistor, and one or more source/drain regions serving as a second capacitor plate and being coupled to associated one of said control lines.

11. An EEPROM cell comprising:
- an N type bulk region;
- a first P type region formed within said N type bulk region serving as the drain of a select transistor;
- a second P type region serving as a source of said select transistor and a drain of a memory transistor;
- a third P type region located within said N type bulk region serving as a source of said memory transistor;
- a select transistor channel located in said N type bulk region between said first and second p-type regions;
- a memory transistor channel region located within said N type bulk region between said second and third P type regions;
- a select transistor control gate located above an insulated from said select transistor channel region;
- a memory transistor floating gate electrode located above an insulated from said memory transistor channel region;
- a thin tunnel dielectric region located between a portion of said floating gate and said memory transistor channel region;
- a fourth P type region located within said N type bulk region;
- a source select transistor channel region located within said N type bulk region between said third and fourth P type regions; and
- a source select transistor control gate located above an insulated from said source select transistor channel region, wherein said floating gate is capacitively coupled to a control gate line, said control gate of said select transistor is coupled to a word line, and said control gate of said source transistor is coupled to a source select line.

12. A structure as in claim 11 wherein said floating gate is formed from a first layer of polycrystalline silicon and said select transistor control gate and said source select transistor control gate are formed from a second layer of polycrystalline silicon.

13. A structure as in claim 12 wherein said floating gate is coupled to said control line by capacitive coupling between a portion of said first layer of polycrystalline silicon serving as a floating gate and a portion of said second layer of polycrystalline silicon serving as said control line.

14. A structure as in claim 11 wherein said floating gate, select transistor control gate and source select transistor control gate are formed from a single layer of polycrystalline silicon.

15. A structure as in claim 14 which further comprises an MOS transistor serving as a capacitor coupled between said floating gate and said control line.

16. A structure as in claim 15 wherein said MOS transistor serving as a capacitor comprises:
- one or more source/drain regions coupled to said control line; and
- a gate electrode coupled to said floating gate.

17. An EEPROM cell as in claim 1 wherein said source and drain of said P channel memory transistor comprises P type regions, said memory well comprises an N type region, and charge transfer takes place between said N type memory well region and said floating gate.

18. An EEPROM cell as in claim 3 wherein said source and drain of said P-channel memory transistor comprises P type regions, said memory well comprises an N type region, and charge transfer takes place between said N type memory well region and said floating gate.

19. An EEPROM cell as in claim 11 wherein said memory transistor channel region adjacent said thin tunnel dielectric region is N type material.

20. A memory array as in claim 4 wherein said source and drain of each said P channel memory transistors comprise P type regions, and each said memory well comprises an N type region, and charge transfer takes place between said N type memory well region and said floating gate.

21. A memory array as in claim 6 wherein said source and drain of each said P channel memory transistors comprise P type regions, and each said memory well comprises an N type region, and charge transfer takes place between said N type memory well region and said floating gate.

22. A memory array as in claim 7 wherein said source and drain of each said P channel memory transistors comprise P type regions, and each said memory well comprises an N type region, and charge transfer takes place between said N type memory well region and said floating gate.

23. A memory array as in claim 9 wherein said source and drain of each said P channel memory transistors comprise P type regions, and each said memory well comprises an N type region, and charge transfer takes place between said N type memory well region and said floating gate.

24. A memory array as in claim 4 which includes one or more of:
- N source lines;
- M source select lines; and
- N control lines.

25. A memory array as in claim 6 which includes one or more of:
- N source lines; and
- M capacitor select lines.

26. A memory array as in claim 7 which includes one or more of:

N source lines; and

M source select lines.

27. A memory array as in claim 9 which includes one or more of:

M source lines;

N source select lines; and

M control lines.

28. A memory array as in claim 4 wherein one or more of the following is satisfied:

source lines are shared;

source select lines are shared; and control lines are shared.

29. A memory array as in claim 6 wherein one or more of the following is satisfied:

source lines are shared; and capacitor select lines are shared.

30. A memory array as in claim 7 wherein one or more of the following is satisfied:

source select lines are shared;

source select lines are shared; and control lines are shared.

31. A memory array as in claim 9 wherein one or more of the following is satisfied:

source lines are shared;

source select lines are shared; and control lines are shared.

32. A nonvolatile memory cell comprising:

a memory transistor, said memory comprising:
  a channel region;
  a source;
  a drain;
  a floating gate electrode; and
  a gate oxide thin enough that electrons can pass between said gate electrode and said channel region under the influence of a high electric field;

a source line;

a bit line;

a source select line;

a control line;

a drain select transistor having a source connected to said drain of said memory transistor and a drain connected to said bit line;

a source select transistor having a drain connected to said source of said memory transistor and a source connected to said source line; and a capacitor connected between said floating gate of said memory transistor and said control lines, whereby writing of the memory cell takes place by applying a high voltage between said gate of the memory transistor and said channel region.

33. A nonvolatile memory as in claim 32 wherein said memory transistor and drain select transistors are P channel transistors.

34. A nonvolatile memory as in claim 33 wherein electrons are added to said floating gate by capacitively coupling said floating gate positive so electrons tunnel from an accumulation region in said channel region, and wherein electrons are removed from said floating gate by capacitively coupling said floating gate negative with respect to said channel region so that electrons tunnel from said floating gate to an inversion region in said channel region.

35. A nonvolatile memory as in claim 34 wherein the conditions for adding electrons to said floating gate are achieved by biasing said bit line and an N type body of said memory transistor and an N type body of said drain select transistor at a low potential and biasing said control line at a high potential, and wherein the conditions for removing electrons from said floating gate are to bias said gate of said source select transistor so that said source select transistor is nonconducting, to bias said gate of said drain select transistor and said control line at a low potential, and to bias said bit line and said bodies of said memory and drain select transistors at a high potential.

* * * * *